(12) United States Patent
Lean et al.

(10) Patent No.: US 7,053,532 B2
(45) Date of Patent: May 30, 2006

(54) RADIALLY POLED PIEZOELECTRIC DIAPHRAGM STRUCTURES

(75) Inventors: Meng H. Lean, Santa Clara, CA (US); Steven A. Buhler, Sunnyvale, CA (US); John S. Fitch, Los Altos, CA (US); Karl A. Littau, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 126 days.

(21) Appl. No.: 10/740,292

(22) Filed: Dec. 18, 2003

(65) Prior Publication Data

US 2005/0134152 A1   Jun. 23, 2005

(51) Int. Cl.
*H01L 41/08* (2006.01)

(52) U.S. Cl. .................. 310/357; 310/324; 310/366; 310/369

(58) Field of Classification Search ............. 310/324, 310/357, 359, 365, 366, 369
See application file for complete search history.

(56) References Cited

U.S. PATENT DOCUMENTS

| | | | | |
|---|---|---|---|---|
| 2,953,755 | A | * | 9/1960 | Mattiat ..................... 333/187 |
| 3,307,052 | A | * | 2/1967 | Neilson et al. ............. 310/338 |
| 3,571,632 | A | * | 3/1971 | DE Jong .................... 310/326 |
| 4,045,695 | A | | 8/1977 | Itagaki et al. |
| 4,170,742 | A | * | 10/1979 | Itagaki et al. .............. 310/324 |
| 5,643,353 | A | | 7/1997 | Wallace et al. |
| 5,663,505 | A | | 9/1997 | Nakamura |
| 6,234,608 | B1 | | 5/2001 | Genovese et al. |
| 6,346,764 | B1 | | 2/2002 | Boyd |

(Continued)

OTHER PUBLICATIONS

Kim, Sunghwan, et al., *Piezoelectric Energy Harvesting Using a Diaphragm Structure*, SPIE's 10 Annual Symposium on Smart Structures and Materials, Mar. 2-6, 2003, San Diego, CA. (11 pages).

(Continued)

*Primary Examiner*—Thomas M. Dougherty
(74) *Attorney, Agent, or Firm*—Fay, Sharpe, Fagan, Minnich & McKee, LLP

(57) ABSTRACT

In accordance with one embodiment of the present application, a piezoelectric diaphragm structure includes a diaphragm, with a piezoelectric material located on the diaphragm. The piezoelectric material is being poled in a radial direction to the piezoelectric material, wherein the poling direction is in-plane with the piezoelectric material. An inter-digitated electrode grid is positioned on a first surface of the piezoelectric material, the inter-digitated electrode grid including a plurality of electrodes configured to selectively receive positive and negative voltage. The application of the positive and negative voltages generate electric fields in the piezoelectric material, at least a portion of which are in-plane with the piezoelectric material, resulting in an actuation of the piezoelectric material, causing a length change of the piezoelectric material in the Radial direction.

In accordance with another embodiment of the present application, provided is a method of actuating a piezoelectric diaphragm structure, including poling a piezoelectric material in a radial direction of the piezoelectric material, wherein the poling direction is in-plane with the piezoelectric material. The piezoelectric material is located in operative contact with the diaphragm, and an electrode arrangement located on a surface of the piezoelectric material is selectively supplied with voltages generating electric fields. The generated electric fields are at least partially in the same plane as the poling direction, resulting in a $d_{33}$ mode of actuation of the piezoelectric material, causing a length change of the piezoelectric material in the Radial direction.

31 Claims, 22 Drawing Sheets

U.S. PATENT DOCUMENTS 6,597,084 B1 * 7/2003 Hu et al. .................... 310/357

OTHER PUBLICATIONS

Kim, Sunghwan, et al., *Piezoelectric Energy Harvesting Using a Clamped Circular Plate: Experimental Verification*, ASME International Mechanical Engineering Congress and Exposition, Washington, D.C., Nov. 2003 (pp. 1-17).

*Fundamentals of Piezoelectricity and Piezo Actuators*, http://www.pi.ws, pp. 4-15 thru 4-17.

Sayer, M., et al., 91-310: *Poling of Piezoelectric Ceramics*, Journal of the Canadian Ceramic Society, vol. 50, 1981 (9 pages).

*Introduction to Piezo Transducers*, Piezo Systems, Inc., http://www.piezo.com/bendedu.html, Jul. 11, 2003, pp. 1-7.

Torah, R.N., et al., *Experimental Analysis of the Substrate Clamping Effects on the Piezoelectric Behaviour of Thick-Film PZT Elements* (7 pages).

* cited by examiner

RADIALLY POLED PIEZOELECTRIC DIAPHRAGM STRUCTURES

BACKGROUND

The present application is directed to piezoelectric diaphragm structures, and more particularly to piezoelectric diaphragm structures having optimized diaphragm displacement.

Piezoelectric diaphragm structures are implemented as actuators which move upon being supplied with electrical energy, and as sensors (e.g., pressure, movement, strain sensors) where diaphragm movement is translated into electrical signals. One particular implementation of a diaphragm structure is as part of an ejection unit used to eject drops such as ink, biofluid or other material from a fluid reservoir. In a desire to improve the efficiency of such ejection units, there is a continuing effort to reduce the voltages required for ejection, create ejector heads with higher nozzle density, and to reduce costs. Reaching these goals requires an improvement in the ejector efficiency, including an efficient diaphragm structure. In particular, an improved diaphragm structure will operate at a lower voltage, increase the volume displacement per volt, while also maintaining a low overall area and retaining adequate diaphragm stiffness.

A previous diaphragm structure is set out in U.S. Pat. No. 4,045,695 to Itagaki et al. which describes an electroacoustic transducer comprising a flexible film of piezoelectric material, at least one electrode being provided on one side of the film, and a plurality of electrodes being provided on the other side of the film to form a piezoelectric diaphragm. The diaphragm is imparted with a locally distinct resiliency and tension, and is implemented in a loudspeaker, making it possible to improve acoustic characteristics, particularly in a high-frequency range.

A second patent, U.S. Pat. No. 4,170,742, also to Itagaki et al., focuses on the specifics of the diaphragm structure layout, including a paddle-shaped first electrode in the center and a "C" second electrode exterior the first.

U.S. Pat. No. 5,663,505 to Nakamura discloses a pressure sensor, which includes a vibrator having a diaphragm valve for detecting pressure. A plurality of circular electrodes are located on planes of first and second piezoelectric bodies wherein the various electrode portions interact causing a radial vibration which acts to expand and contract the device in opposite directions. Operation of the upper and lower electrodes are intended to cause radial motion, without motion out of plane.

These references do not particularly discuss a design directed to optimizing the deflection of the diaphragm which increases the deflection per voltage applied. They also do not, among other concepts, define a structure, used in conjunction with the poling and actuation operations, which achieves optimized diaphragm operation.

SUMMARY

In accordance with one embodiment of the present application, a piezoelectric diaphragm structure includes a diaphragm, with a piezoelectric material located on the diaphragm. The piezoelectric material is poled in a radial direction to the piezoelectric material, wherein the poling direction is in-plane with the piezoelectric material. An inter-digitated electrode grid is positioned on a first surface of the piezoelectric material, the inter-digitated electrode grid including a plurality of electrodes configured to selectively receive positive and negative voltage. The application of the positive and negative voltages generate electric fields in the piezoelectric material, at least a portion of which are in-plane with the piezoelectric material, resulting in an actuation of the piezoelectric material, causing a length change of the piezoelectric material in the Radial direction.

In accordance with another embodiment of the present application, provided is a method of actuating a piezoelectric diaphragm structure, including poling a piezoelectric material in a radial direction of the piezoelectric material, wherein the poling direction is in-plane with the piezoelectric material. The piezoelectric material is located in operative contact with the diaphragm, and an electrode arrangement located on a surface of the piezoelectric material is selectively supplied with voltages generating electric fields. The generated electric fields are at least partially in the same plane as the poling direction, resulting in an actuation of the piezoelectric material, causing a length change of the piezoelectric material in the Radial direction.

With attention to still a further embodiment of the present application, a diaphragm structure includes a diaphragm, with a piezoelectric material located on the diaphragm. The piezoelectric material is poled in a radial direction of the piezoelectric material, wherein the poling direction is in-plane with the piezoelectric material. An electrode arrangement is positioned on a first surface of the piezoelectric material, the electrode arrangement configured to receive or pass electrical charges. Receipt of the voltages generates electric fields in the piezoelectric material, at least a portion of which are in-plane with the piezoelectric material and which results in an actuation of the piezoelectric material. Alternatively, the movement of the diaphragm generates electrical charges which are passed.

BRIEF DESCRIPTION OF THE DRAWINGS

FIGS. 8A and 8B illustrate an oxide mesa design which may be used to connect to electrodes of each of the diaphragm structure embodiments;

DETAILED DESCRIPTION

The following description primarily emphasizes the use of a diaphragm structure as an actuator, wherein electric signals are provided to the diaphragm structure, causing movement. It is to be appreciated, however, the descriptions set forth herein are equally applicable to the use of a diaphragm structure as a sensor. In this design the diaphragm structure is used to generate output signals whereby the pressure or other physical environmental actions imposed on the diaphragm structure are sensed and delivered to an external source.

Figure 1:
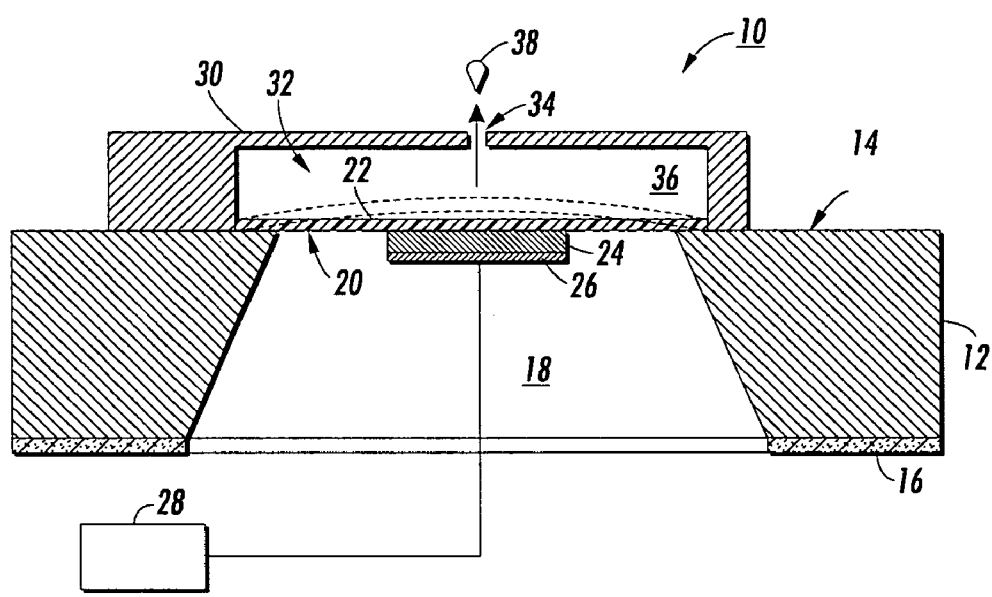
FIG. 1 is a conceptual drawing showing a piezoelectric ejection unit which may implement a diaphragm structure of the present application.

FIG. 1 illustrates a conceptual drawing showing a piezoelectric ejection device 10, which includes a plate 12 having two parallel surfaces 14, 16. The plate may be made from a metal, and anisotropically etched or otherwise manufactured to provide a recess 18 therein. Alternatively, plate 12 may be a silicon, glass or ceramic laminate where recess 18 is provided by an appropriate process, including, for example, by etching, molding or laser ablation. The recess 18 has a bottom surface 20 which is substantially parallel to plate surface 14, in order to form a relatively thin membrane for use as a diaphragm 22. Alternatively, the diaphragm may be a separate plate which is laminated or attached to the plate 12 after recess 18 is formed.

The recess bottom surface and thus the surface area of the diaphragm is predetermined to permit the appropriate deformation. Bottom surface 20 has a piezoelectric material 24 built, deposited or otherwise attached. An electrode 26 is positioned on a surface of the piezoelectric material 24, and is connected to a source of energy 28 such as a power supply. A nozzle plate 30 is formed on plate surface 14 and has an internal cavity 32, open against the plate surface and aligned with the diaphragm 22, to act as a fluid reservoir. The nozzle plate 30 has a nozzle 34 which may be centrally aligned with the diaphragm 22 or may be offset as appropriate. Cavity 32 is filled with fluid 36 through an inlet (not shown).

Actuation of energy source 28, causes energy, such as in the form of voltage, to be applied to piezoelectric material 24 via electrode 26, which in turn deforms the diaphragm 22 in the upward direction towards nozzle 34, as shown in dashed line. This action increases the pressure on fluid 36 in cavity 32, initiating the ejection process. A droplet 38 is ejected from nozzle 34 as diaphragm 22 moves upward. The diaphragm then moves in a direction away from the nozzle, as when voltage is removed from electrode 26.

Turning to FIGS. 2A–4B, illustrated are three circular piezoelectric disc diaphragm structures in accordance with the present application. It is to be understood that the diaphragm structures in this and other embodiments, are described with particular reference to a substantially circular design. However, such a description is only intended for ease of explanation and is not intended to limit the embodiments to circular designs. Rather, the disclosed concepts are equally applicable to other geometric shapes, such as but not limited to rectangular, diamond, rhombus. In these instances, the structures would therefore have a central region (i.e., equating to a disc) or an outer edge region (i.e., equating to an annulus).

Figure 2A:
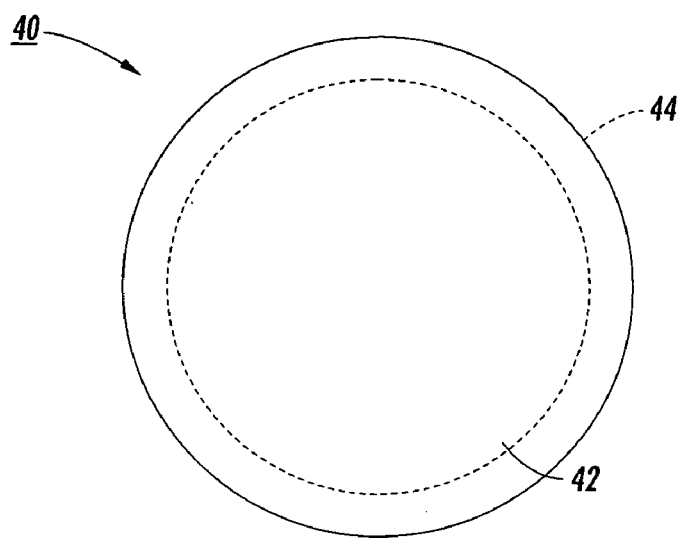
FIGS. 2A and 2B, respectively, illustrate a disc diaphragm structure in accordance with the present application.
Figure 2B:
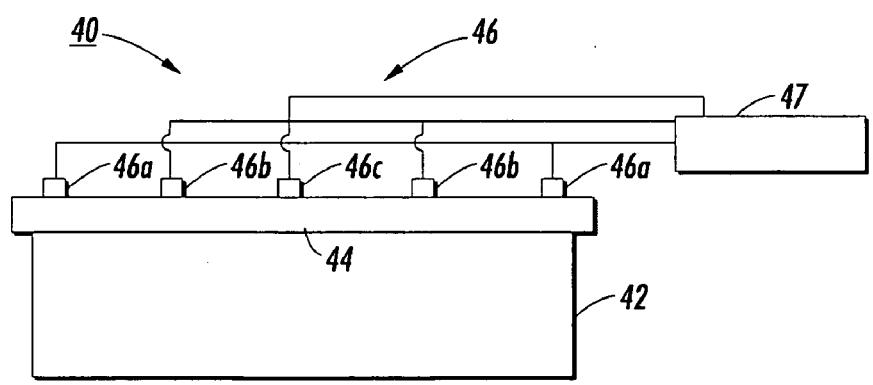

FIGS. 2A and 2B, are top and side views of a disc piezoelectric diaphragm structure 40, which includes a diaphragm 42 having an appropriate stiffness for an intended use, such as but not limited to stainless steel.

Diaphragm 42 is covered by a piezoelectric disc 44. As shown in FIGS. 2A and 2B, the piezoelectric disc 44 may overlap diaphragm 42. While not illustrated in this figure, diaphragm 42 may be part of a larger structure, such as plate 12 of FIG. 1. Therefore, the overlapping piezoelectric disc 44 would cover a portion of such a plate, clamp or anchor-type structure. As shown more clearly in FIG. 2B, piezoelectric disc 44 has attached to a first or top surface an electrode arrangement, such as an inter-digitated electrode grid 46, comprised of a plurality of electrodes 46a–46c. Although not shown in this figure, disc diaphragm structure 40 may also include either a single electrode or multiple electrodes on a second or bottom surface of piezoelectric disc 44. In one implementation, block 47 is a power supply which drives electrodes 46a–46c, causing a deformation of piezoelectric disc 44, which in turn causes movement of diaphragm 42. In this implementation, the disc diaphragm structure 40 is used as an actuator. In an alternative implementation, disc diaphragm structure 40 may be designed as a sensor, where physical movement of diaphragm 42 causes movement of piezoelectric disc 44, which in turn generates electrical signals. In this embodiment, block 47 is a device which receives the electrical signals from electrodes 46a–46c.

Figure 3A:
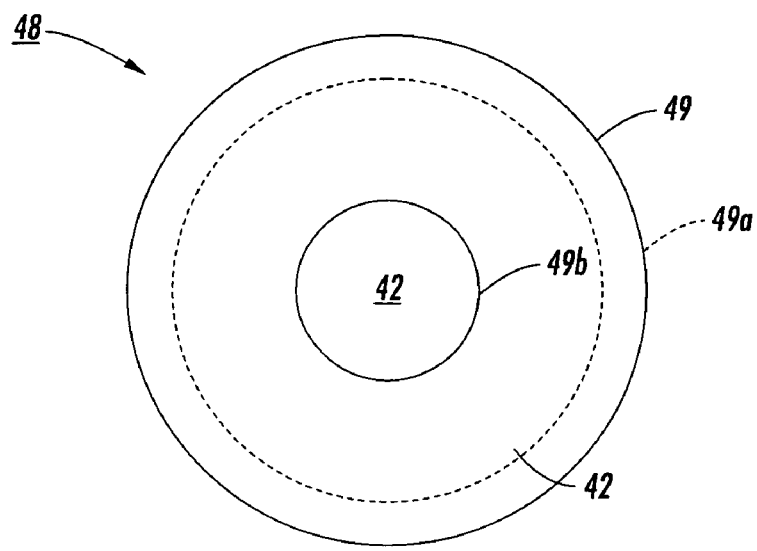
FIGS. 3A and 3B illustrate an annular ring diaphragm structure in accordance with the present application.
Figure 3B:
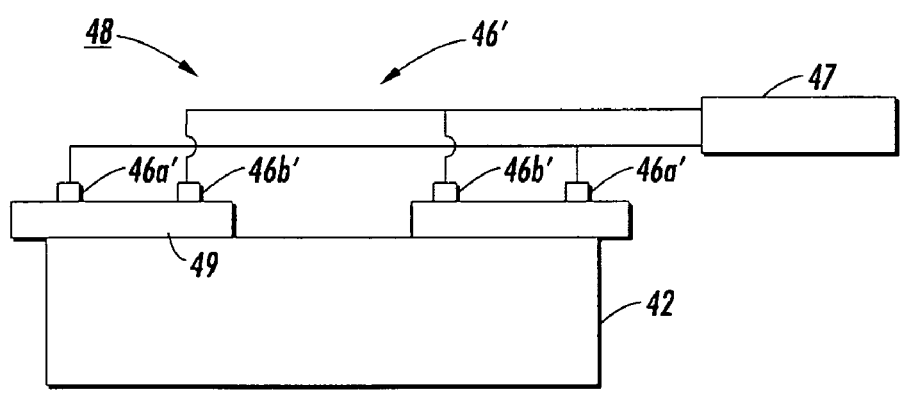

Turning to FIGS. 3A and 3B, illustrated is an piezoelectric annular diaphragm structure 48 in accordance with a second embodiment of the present application. In this design, diaphragm 42 is covered by a piezoelectric annular ring 49, having an outer radius 49a, and an inner radius 49b. The inner radius 49b is a distance from the center of the diaphragm 42, whereby an inner area of diaphragm 42 is not covered by the piezoelectric annular ring 49.

As shown in FIG. 3B, a plurality of electrodes 46a', 46b' of an electrode arrangement, such as an inter-digitated electrode grid 46' are on a first or upper surface of annular ring 49. Since there is no piezoelectric material at the inner area of diaphragm 42, electrode 46c of FIG. 2B is not used. Also, similar to FIG. 2B, this device may be operated either as an actuator, or a sensor, similar to that described above.

Figure 4A:
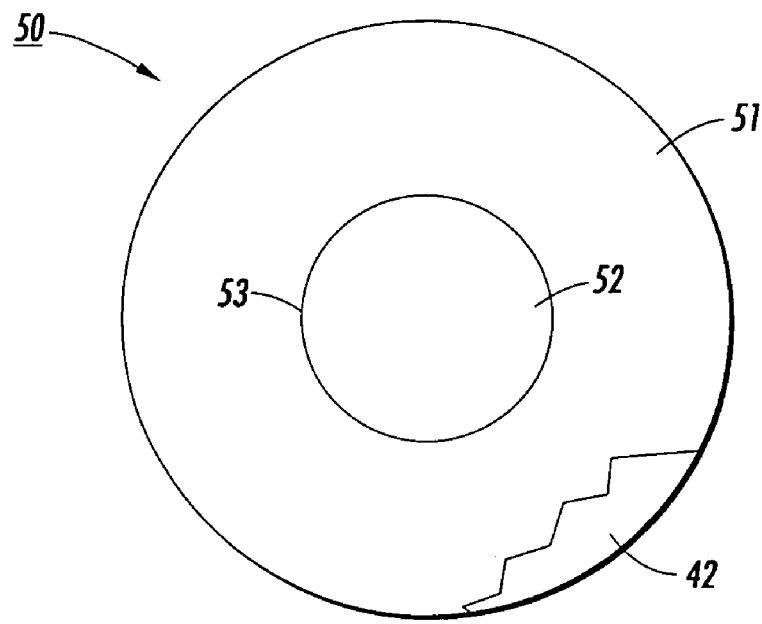
FIGS. 4A and 4B illustrate a two-region diaphragm structure in accordance with the present application.
Figure 4B:
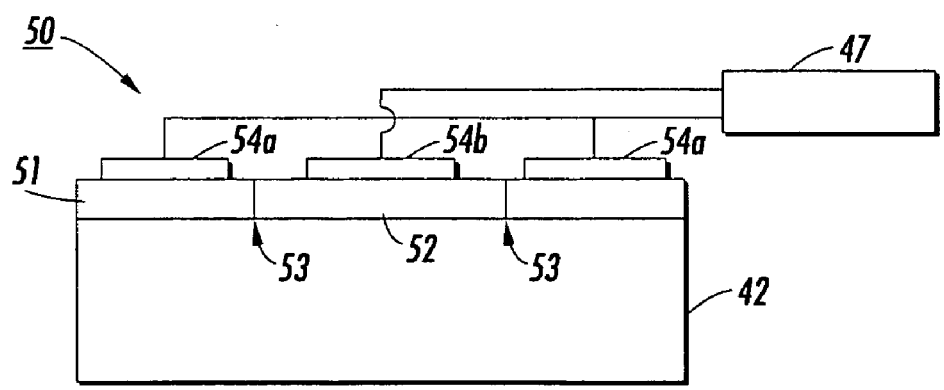

Turning to FIGS. 4A and 4B, set forth is a piezoelectric two-region diaphragm structure 50 in accordance with a third embodiment of the present application. Two-region diaphragm structure 50, includes a piezoelectric annular ring region 51 and a piezoelectric disc region 52 separated by boundary 53. These regions are concentric and are attached to diaphragm 42, which, similar to the previous embodiment, may be made of any material having appropriate stiffness for an intended use, such as but not limited to stainless steel, similar to FIGS. 2A–3B.

An upper surface of annular ring region 51 carries a first electrode 54a, and upper surface of disc region 52 carries a second electrode 54b, which form an electrode arrangement. Similar to FIGS. 2B and 3B, block 47 may represent a power source or a signal receiving device, dependant upon whether the two-region diaphragm structure 50 is operational as an actuator or sensor.

Figure 5A:
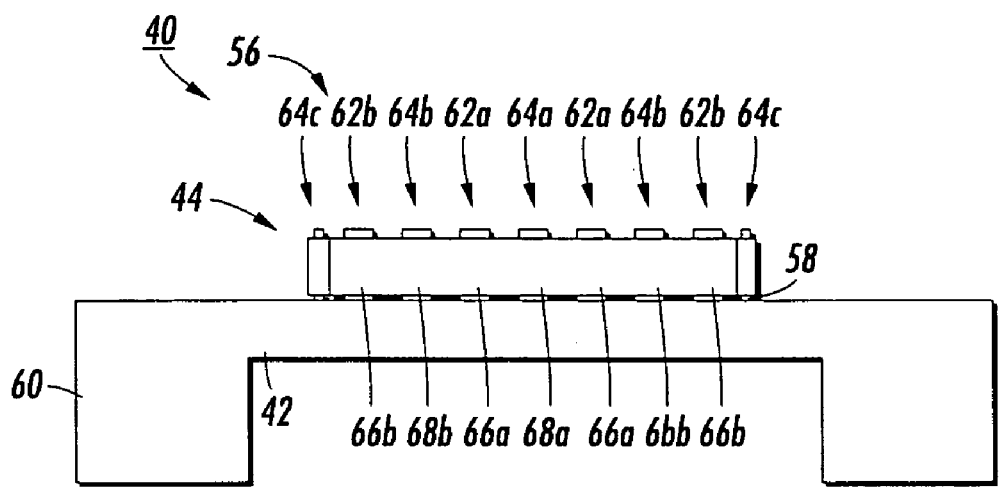
FIGS. 5A and 5B, respectively, show a partial cross-sectional view and a partial top view of the annular ring diaphragm structure.
Figure 5B:
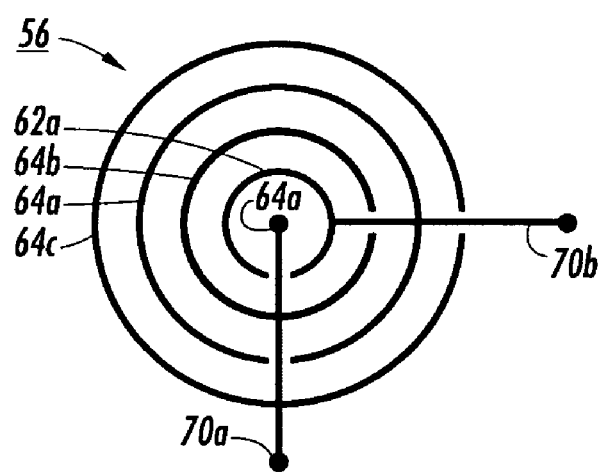

Turning to the partial cross-sectional view of FIG. 5A and partial top view of FIG. 5B, a more detailed discussion is provided for circular piezoelectric disc 44, of disc diaphragm structure 40, which carries a first inter-digitated electrode (IDE) grid 56 on a first or top surface, and an optional second inter-digitated electrode (IDE) grid 58 on a second or bottom surface. The numbering of electrodes of FIG. 2B (i.e., 46a–46c) is replaced in the present discussion with new numbering for convenience of explanation. Diaphragm 42, on which piezoelectric disc 44 is located, is part of a larger component such as plate 12 of FIG. 1, or other appropriate design. In this arrangement diaphragm 42 is held by clamp or anchor section 60. Diaphragm 42 and clamp or anchor section 60 may be formed as a single integrated body, or these sections may be individual components fastened together by known techniques. Piezoelectric disc 44 may overlap diaphragm 42 and extend onto the anchor 60.

Inter-digitated electrode (IDE) 56, includes a plurality of electrodes 62a–62b, and electrodes 64a–64c. Electrodes 62a–62b and 64a–64c are circular in construction, to correspond with the circular piezoelectric material. In practice, electrodes 62a–62b have applied voltages of an opposite sign of electrodes 64a–64c. In an alternative design, optional IDE 58 may be replaced with a single electrode.

FIG. 5B, which is a top view of IDE 56, also shows electrical conductors 70a, 70b used to provide energy to electrodes 62a–62b and 64a–64c. Electrodes 64a–64c are connected to a first conductor 70a. The supplied electrodes 62a–62b are shown with gaps not touching conductor 70a. A similar design is used in connection with second conductor 70b. Conductors 70a and 70b may be provided in the Z-axis perpendicular to the electrodes.

Figure 6A:
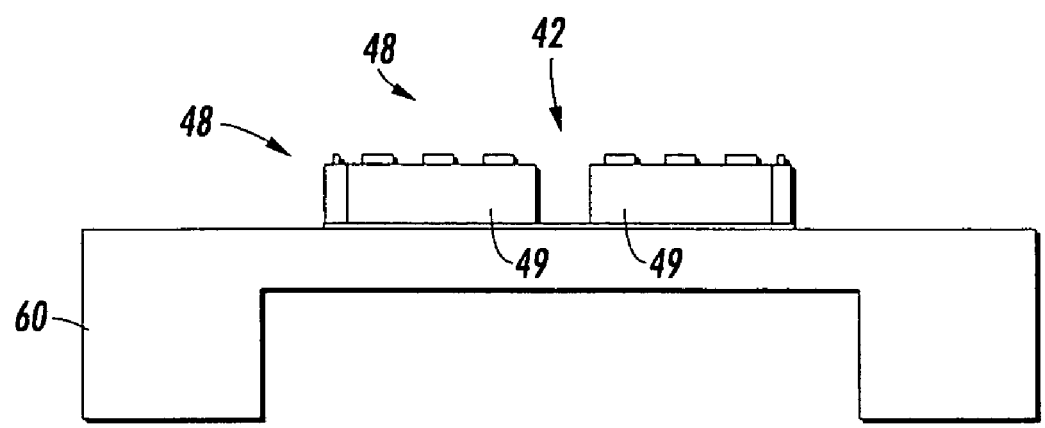
FIGS. 6A and 6B, respectively, are partial cross-sectional and partial top views of an annular ring diaphragm structure without center electrodes.
Figure 6B:
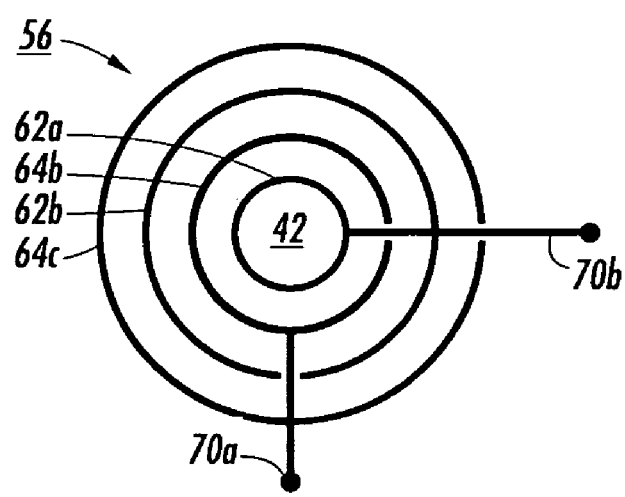

FIGS. 6A and 6B, are partial cross-sectional and top views of annular ring diaphragm structure 48. In this design, since the center of diaphragm 42 is not covered with piezoelectric material, middle electrode 64a is not used. The remaining electrodes and other numbered elements are the same as shown in FIGS. 5A and 5B. As will be expanded on in following sections, removal of the center portion of the piezoelectric material will, in some driving arrangements, permit increased movement of the piezoelectric annular ring 49, resulting in greater diaphragm deflection.

Figure 7A:
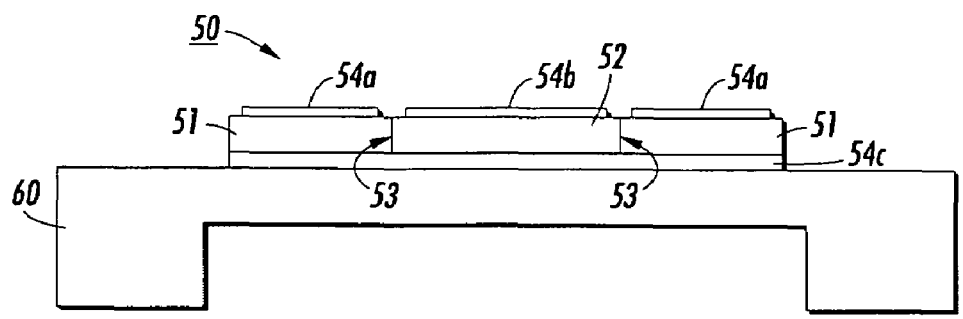
FIGS. 7A and 8B are, respectively, partial cross-sectional and top views of a two-region diaphragm structure.
Figure 7B:
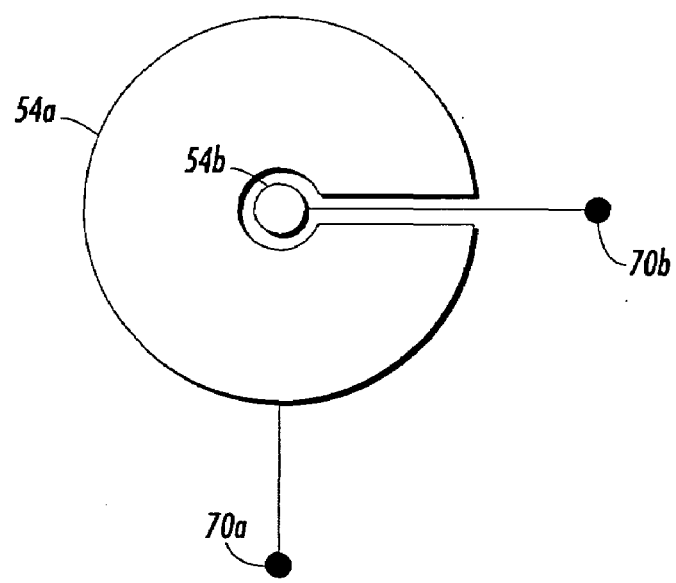

FIGS. 7A and 7B are partial cross-sectional and top views of two-region diaphragm structure 50. In addition to electrode 54a on a top surface of annular ring 51, and electrode 54b on a top surface of disc 52, an electrode 54c may be located on a bottom surface across both the annular ring region 51 and disc region 52. FIG. 7B shows the annular ring electrode 54a connected to conductor 70a, and disc electrode 54b connected to conductor 70b. These conductors are provided to a power source configuration (not shown) which drives the independent electrodes. In this embodiment, the entire diaphragm is covered with piezoelectric material, therefore, the stiffness of the diaphragm is maintained to a greater degree than diaphragm structures presently available, which tend to locate the edge of the piezoelectric material close to the edge of the active diaphragm, or somewhat interior. Those existing designs cause the stiffness of the diaphragm to be reduced at the edge of the active region, which affects the overall diaphragm stiffness. In FIGS. 5A, 6A and 7A the piezoelectric material 44 may extend beyond the diaphragm 42, thus further increasing the stiffness. The increased stiffness afforded by the diaphragm structures in these figures improve performance in fluid-ejecting applications, as the resonance frequencies will be maintained at a higher level.

Figure 8A:
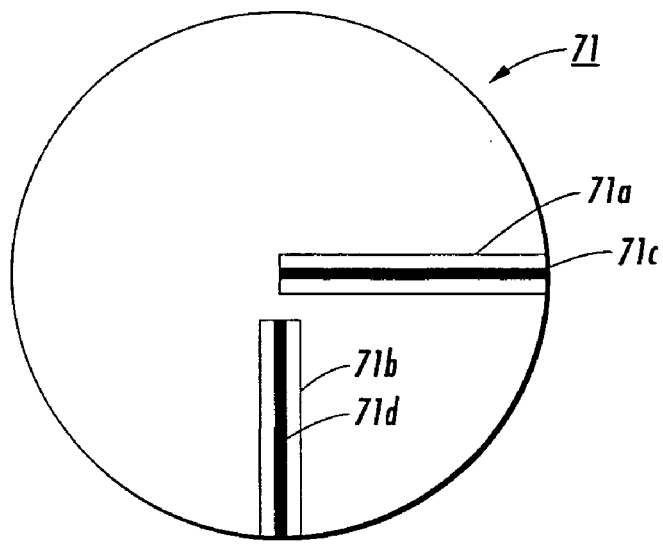
Figure 8B:
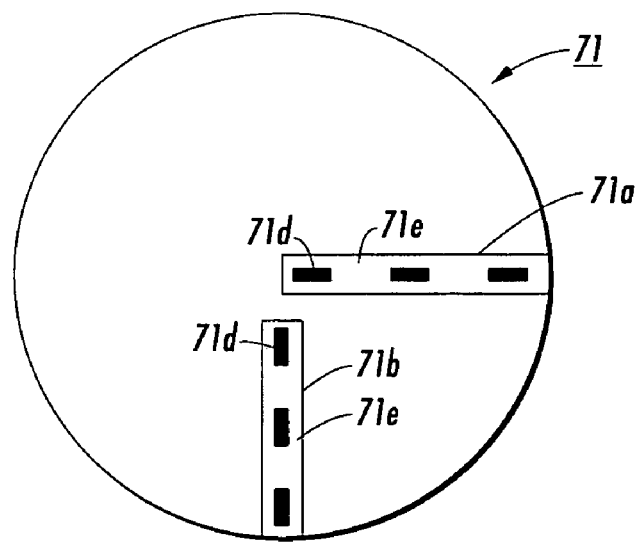

As previously mentioned, each of the foregoing embodiments may have conductors 70a and 70b provided in the Z-axis perpendicular to the electrodes. It is to be appreciated, however, that other connection schemes may be used. One such alternative is, for example, shown by FIGS. 8A and 8B. This design employs an oxide mesa 71 to which the electrodes of piezoelectric material are attached. Grooves 71a, 71b are formed in mesa 71 from approximately an area corresponding to the center of the mesa to the edge of the mesa. Metal lines 71c and 71d are patterned or deposited within grooves 71a, 71b, providing external connections. The metal lines 71c, 71d in the grooves are selectively covered by an overcoat oxide 71e, such that metal which corresponds to electrodes, remains exposed. Then when placed into contact with the diaphragm structures (e.g., 40, 48, 50) appropriate connections to the electrodes are made. A similar connection to electrode 54c of FIG. 7A or array 58 of FIG. 5A may also be made.

Figure 9A:
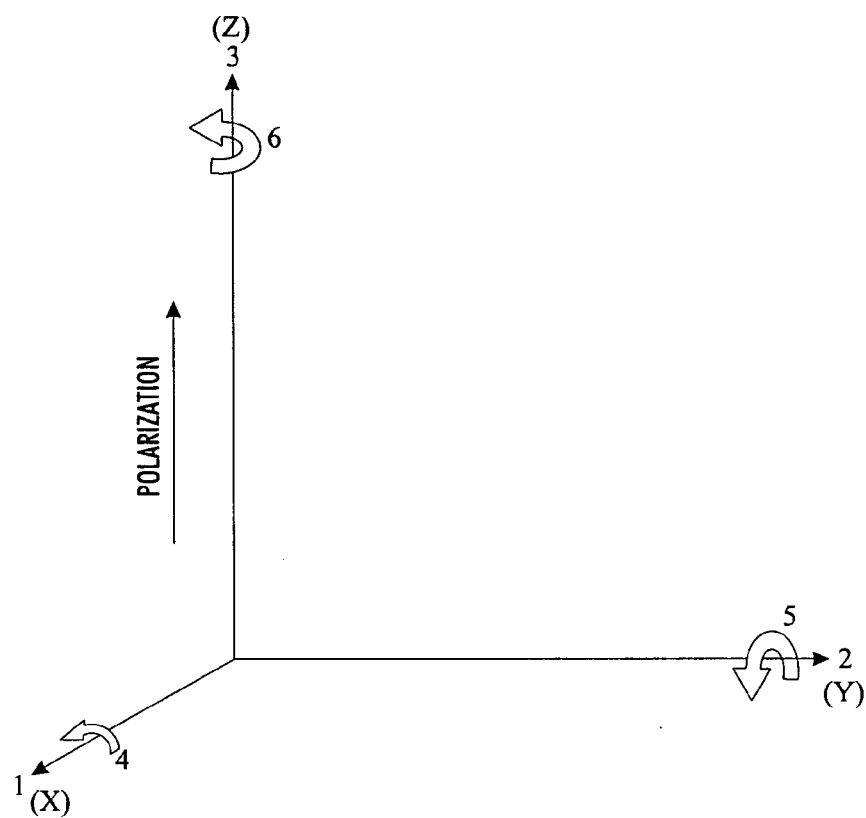
FIG. 9A identifies directions of the axes of poling directions in a conventional coordinate system.
Figure 9B:
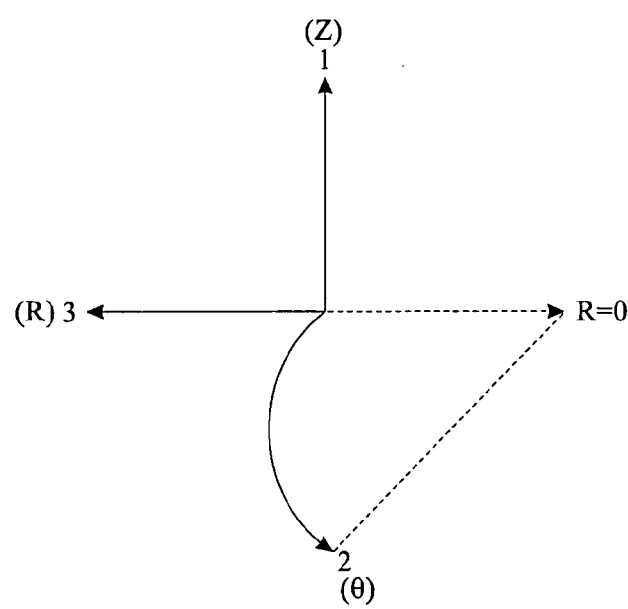
FIG. 9B identifies directions of the axes of poling directions in a cylindrical coordinate system.

Turning to the manufacture of the piezoelectric diaphragm structures, a stage of manufacture includes poling of the piezoelectric material. Due to the anisotropic nature of piezoelectric material, effects are dependant upon direction. Therefore, as depicted in FIG. 9A, to identify directions in one design, the axes or directions, termed 1, 2 and 3, are introduced, analogous to X, Y and Z of the classical right-hand orthogonal coordinate system. The axes 4, 5 and 6 identify rotations (i.e., shear). In another design, and as will be explained in more detail below, the convention of direction described in FIG. 9A is altered or rotated to a position such as shown in FIG. 9B. In this coordinate system, the reference directions are provided in what may be considered a cylindrical coordinate system, where direction 1 is in the Z-axis, direction 3 is now in a radial in-plane direction, and direction 2 is designated as a θ position, representing the cylindrical aspect of the coordinate system. FIG. 9B is intended to emphasize an alternative polarization mode which will be expanded on below.

The poling process uses relatively high voltages to obtain the required applied field, creating the possibility of dielectric breakdown under the high applied field. Therefore, an objective of the poling process is to provide a maximum amount of reorientation of the piezoelectric domains using the lowest applied field in the shortest possible time. A number of poling techniques, including DC poling, DC plus AC poling, as well as pulse or switched DC poling, have been described, and any of these or other appropriate poling techniques may be used. These poling techniques may be implemented with elevated temperatures to facilitate the poling operations.

Once the piezoelectric material has been poled, application of an electric field (E-field) will displace the piezoelectric. This displacement of the poled piezoelectric is primarily a function of the applied electric field strength (E), the piezoelectric used, and the length (L) of the piezoelectric. The material properties can be described by the piezoelectric strain coefficients $d_{ij}$, which describe the relationship between the applied electrical field and the mechanical strain produced.

The most common mode of operation is a $d_{31}$ mode which applies when polarization of the piezoelectric is in direction 3 of the classic orthogonal coordinate system—where the electric field points in the direction 3 (i.e., FIG. 9A)—and the strain is in the 1 axis (i.e., orthogonal to the polarization axis). An alternative mode of operation, which has been considered by the inventors is a $d_{33}$ mode, which occurs when polarization is in direction 3 of the cylindrical coordinate system—where the electric field points in the direction 3 (i.e., FIG. 9B)—and the strain (deflection) is along the same axis. Thus, operation in the $d_{31}$ mode (with reference to FIG. 9A) will include having polarization in the Z-axis (direction 3) extending out of the piezoelectric material, where the E-field will be applied in the Z-axis (direction 3). On the other hand, operation in the $d_{33}$ mode reflects the coordinate system shown in FIG. 9B, where, the poling direction is in the R (radial) axis (direction 3) with the applied E-field also being in direction 3.

In the $d_{31}$ mode, applying the E-field in direction 3 at a first polarity causes the piezoelectric to expand, and reversing the polarity causes contraction.

In the $d_{33}$ mode, when the generated E-fields are parallel to the poling direction, the design is in a parallel state, and the piezoelectric will expand. When an expanding piezoelectric is built on or otherwise attached to a diaphragm, the expansion of the piezoelectric causes bending motion of the diaphragm, thereby resulting in the overall structure moving to a convex position when observed from the piezoelectric side. Contraction of the piezoelectric will occur when the E-field is anti-parallel the poling direction, which pulls in the piezoelectric, causing a counter bending reaction in the diaphragm, resulting in movement to a concave position. Thus, in the two-region diaphragm structure such as structures 40 and 50, actuation of the first area causes a length change in the Radial direction and actuation of the second area causes a length change in the Radial direction of an opposite sign of the first area.

In the embodiments of FIGS. 2A, 2B, 3A, 3B, 5A, 5B and 6A, 6B, both the polarization axis and the applied electric field are applied in the plane of the piezoelectric along the R-axis. Thus, operation is in a $d_{33}$ mode, as mode $d_{33}$ applies when the electric field is along the polarization axis (direction 3) and the strain (deflection) is measured along the same axis. The common mode of operation for existing diaphragm structures is to operate in a $d_{31}$ mode which applies when the polarization and the E-field are in the Z-direction as before, but the strain is in the 1 axis (i.e., orthogonal to the polarization axis). FIGS. 4A and 4B operate in this manner.

Figure 10A:
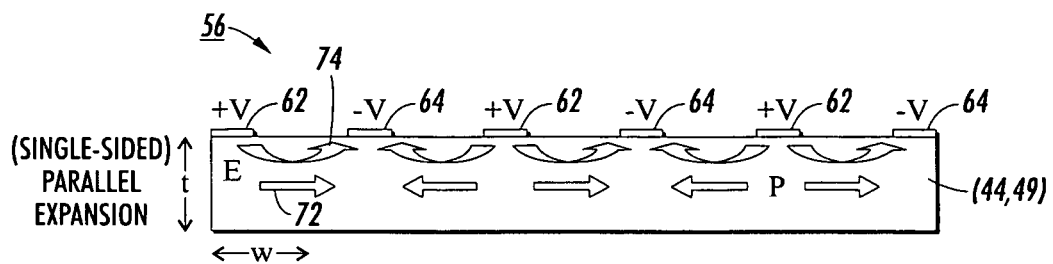
FIG. 10A illustrates a partial view of an inter-digitated electrode arrangement in a parallel piezoelectric expansion state.

To illustrate operation in the $d_{33}$ mode, attention is directed to FIG. 10A, which shows a partial view of inter-digitated electrode arrangement (IDE) 56 carried on a piezoelectric (e.g., 44 or 49) where the mode of actuation is the $d_{33}$ mode, i.e., both the poling and E-field are in-plane with the piezoelectric and pointed in the R-axis direction. This design, makes it possible to take advantage of the transverse changes in geometry obtained in the $d_{33}$ mode, which are two to three times larger than the transverse changes available in the $d_{31}$ mode, for most piezoelectric materials. The preceding concepts may also be applicable to the two-region diaphragm structure 50. However, as that embodiment does not use an IDE (with a plurality of electrodes) the figures would be slightly different.

In FIG. 10A, the poled direction is illustrated by arrows 72, which are generally or at least partially in-plane with the piezoelectric. The generated E-fields are shown by arrows 74, which are parallel to the arrows representing poling direction 72. When in a parallel state, the piezoelectric will expand when voltage is applied to the electrodes of IDE 56.

When an expanding piezoelectric is built on or otherwise attached to a diaphragm, the expansion of the piezoelectric causes bending of the diaphragm. The convex region near the clamp 60 causes more motion than the region in the center, thus forcing the center region downward and forcing a concave shape near the center.

Figure 10B:
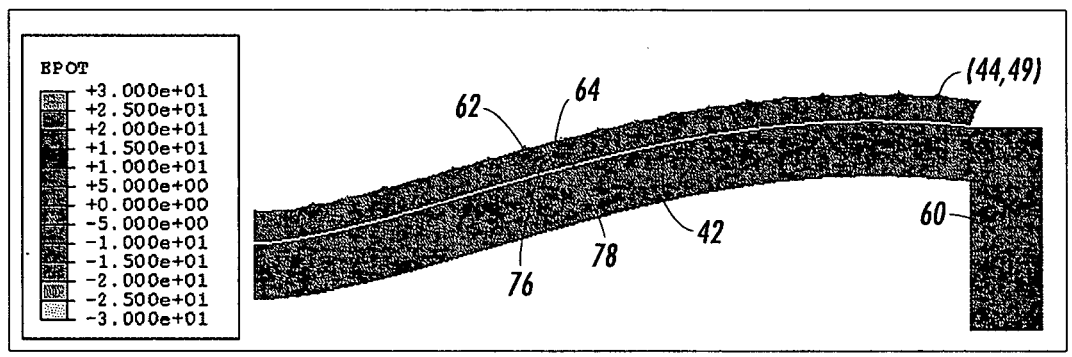
FIGS. 10B and 10C show a partial diaphragm structure in a concave position.
Figure 10C:
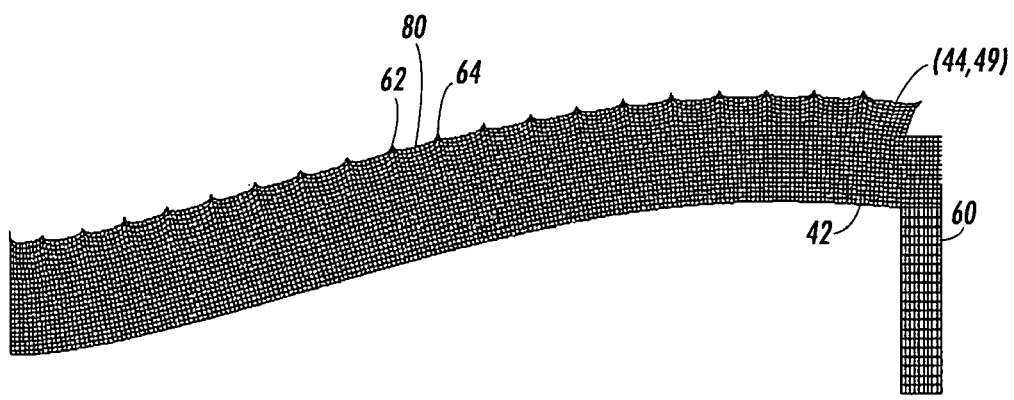

This concept is illustrated more particularly in connection with FIGS. 10B and 10C. In FIG. 10B, base or clamp 60 holds one end of diaphragm 42, which carries piezoelectric material (e.g., 44 or 49). As previously mentioned, operation is in the $d_{33}$ mode as E-fields are formed by application of voltage to electrodes (e.g., 62, 64), the piezoelectric material begins to expand, causing the thickness of the inter-electrode regions 80 to grow thinner. This pushes electrodes 62, 64, forming a scalloped top surface as shown in FIG. 10C. It is noted that FIG. 10C is exaggerated for explanation purposes.

With continuing attention to FIG. 10B, the depth of the applied positive 76 and negative 78 voltages into the piezoelectric (e.g., 44 or 49) are visually illustrated. In this embodiment, the value of the applied voltage ranges from +3 volts to −3 volts.

Figure 11A:
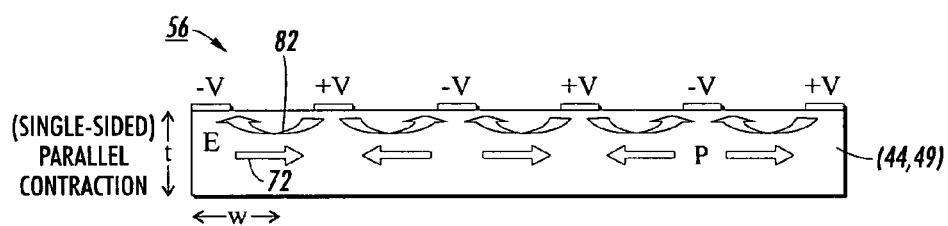
FIG. 11A illustrates a partial view of an inter-digitated electrode arrangement in an anti-parallel piezoelectric contraction state.
Figure 11B:
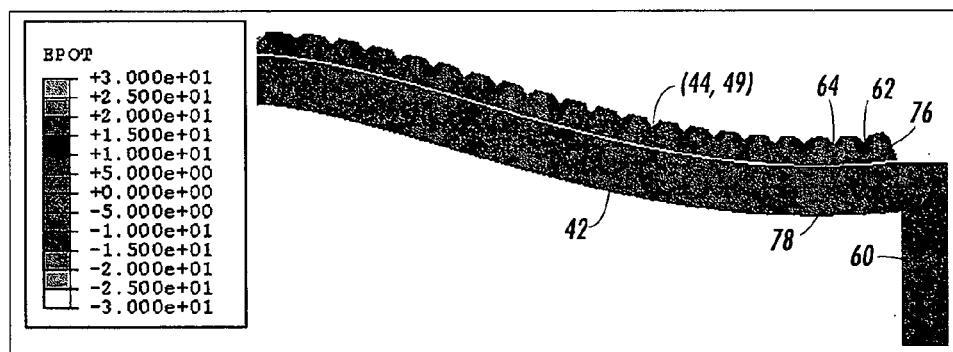
FIGS. 11B and 11C show a partial diaphragm structure in a convex position.
Figure 11C:
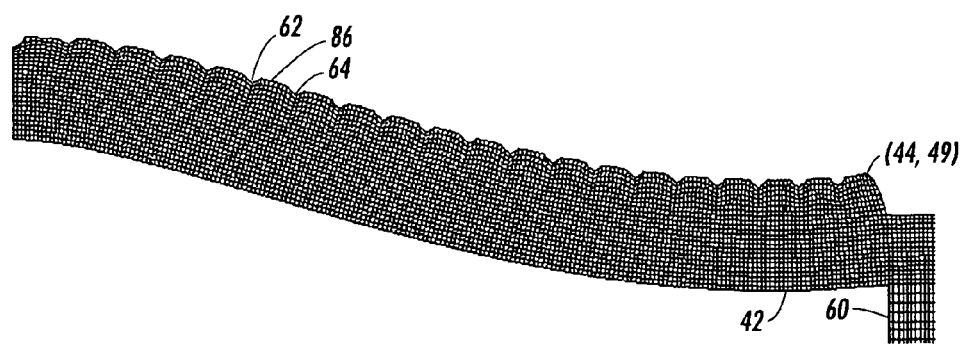

Turning to FIG. 11A, shown is inter-digitated electrode (IDE) configuration 56, such as in FIG. 10A, except that the applied E-field 82 is anti-parallel to the poled direction 72. This arrangement results in a contraction of the piezoelectric (e.g., 44 or 49). As depicted in FIGS. 11B and 11C, contraction of the piezoelectric results in the inter-electrode regions 86 to bulge above electrodes 62 and 64. This contraction pulls in the piezoelectric, causing a counter bending reaction in diaphragm 42, resulting in movement to a concave position in the region near the clamp.

Thus, when E-fields are applied parallel to and in-plane with the poling direction, the piezoelectric expands causing the inter-electrode regions to stretch sideways, pulling in the surface to conserve volume and leaving the electrode regions to form small protrusions. For contraction, the E-fields are in-plane with and anti-parallel to the poling direction, causing the inter-electrode regions to contract sideways, pushing out the surface, and leaving the electrode regions to form depressions.

The foregoing has described diaphragm structures which provide improvements over existing diaphragm structures by implementing a circular diaphragm with inter-digitated or two electrode control, where the applied E-field is in-plane with the poling direction, such that the diaphragm structure operates in a $d_{33}$ mode. The described diaphragm structures may be operated as a piezoelectric disc design or a piezoelectric annular ring design.

The performance of the described diaphragm structures depends on several factors, including: the pitch (p) of the electrodes, the electrode duty cycle (w/p—i.e., width-to-pitch ratio), the resulting penetration of the E-field, and the nominal E-field strength. For efficient usage, the pitch is maximized while minimizing electrode duty cycle for any level of E-field strength. The piezoelectric effect is a volumetric response that is dependent on the penetration of E-fields into the piezoelectric. The depth of penetration depends on a ratio between the pitch (p) to piezoelectric thickness ($t_{PZT}$) (i.e., $p/t_{PZT}$) which, as will be described, has been determined to be approximately 5 for a practical implementation using a single-sided IDE design. As noted, a second IDE may be added to an opposite surface of the piezoelectric to improve the piezoelectric effect. In comparison to the $d_{31}$ mode traditionally used in parallel plate electrode (PPE) configurations, in the $d_{33}$ mode the bias voltage scales only with the electrode pitch, not the piezoelectric thickness.

Figure 12:
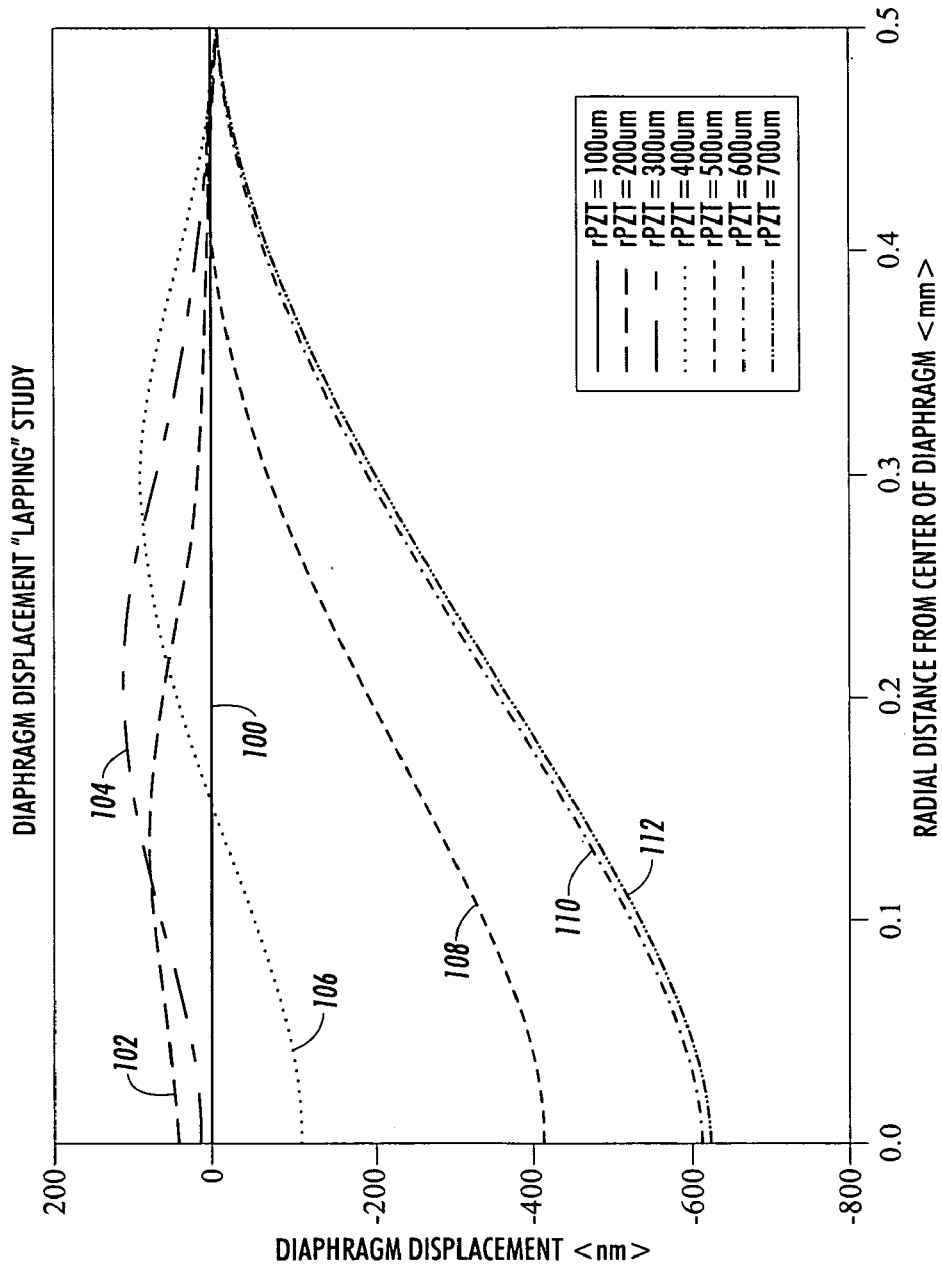
FIG. 12 is a chart presenting the results of a diaphragm displacement lapping study.

The chart of FIG. 12 presents the results of a finite element simulation of a piezoelectric on stainless steel diaphragm related to diaphragm displacement and the effects of overlapping and underlapping between the piezoelectric and the diaphragm, (i.e., $r_{PZT}/r_{Diap}$). The study used the following specifications: Diaphragm radius ($r_{Diap}$)=0.5 mm (500 μm), Piezoelectric thickness ($t_{PZT}$)=20 μm, Diaphragm thickness ($t_{Diap}$)=35 μm, height (h)=2.5 μm, Electrical field (E)=3V/μm, Pitch (p)=100 μm, and Duty cycle (dc)=10%.

The simulation investigated a variety of scenarios where a 500 μm circular diaphragm was actuated by circular piezoelectric discs ranging from 100 μm to 700 μm in diameter. The developed curves 100–112 are plotted to reflect the diaphragm displacement (nm) in accordance with a radial distance from the center of the diaphragm (mm). Curves 100–112 show the transition of the diaphragm shape, which has a positive displacement for piezoelectric discs with smaller radii, and rapidly evolves into negative displacements for piezoelectric discs having larger radii, e.g., from 400 μm (0.8 underlap) to 700 μm (1.4 overlap). Curve 100 shows no deflection, since there was only one electrode on the piezoelectric.

Curve 112 represents a situation where the radius of the piezoelectric ($r_{PZT}$)=700 μm, whereas the radius of the diaphragm ($r_{Diap}$) is 500 μm, resulting in a 200 μm overlap. Measured at the center of the diaphragm, the displacement is over −600 nm as shown by curve 112. Thus, the largest diaphragm displacement in this study occurs when $r_{PZT}$=700 μm. The displacement characteristics of the remaining curves may be understood from the foregoing discussion.

Figure 13:
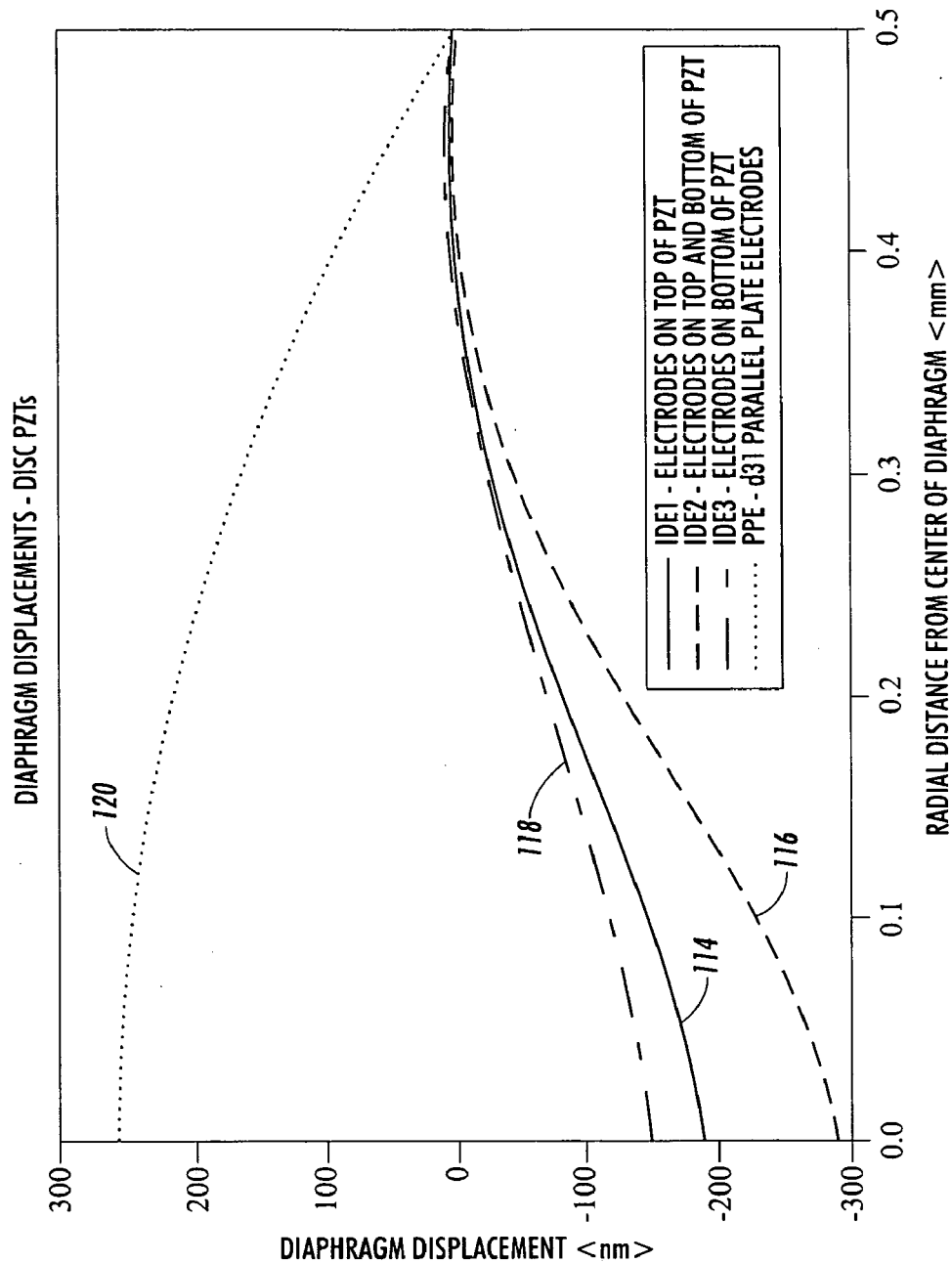
FIG. 13 is a chart representing a diaphragm displacement study for a disc piezoelectric.
Figure 14:
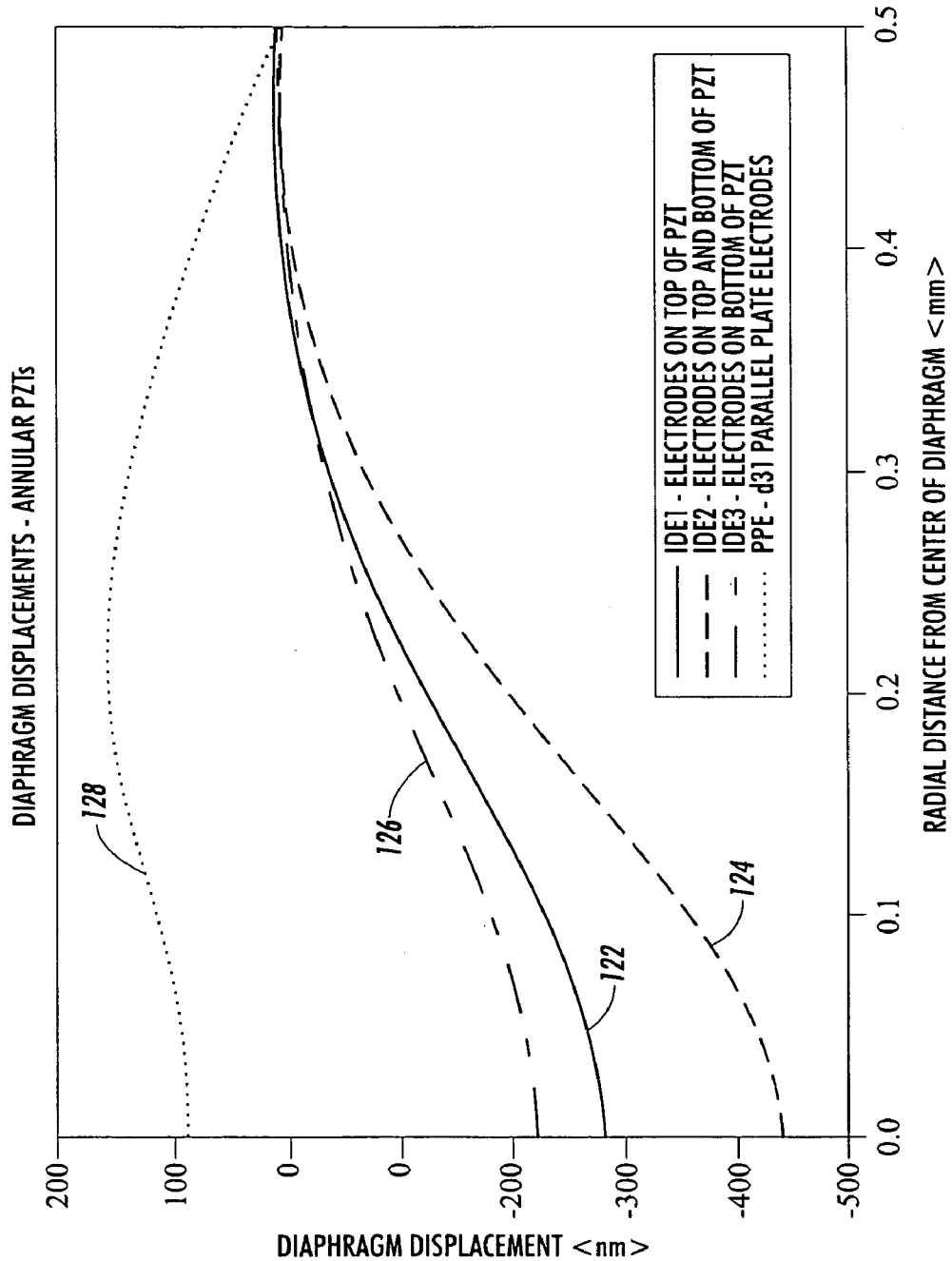
FIG. 14 illustrates a diaphragm displacement study for an annular ring piezoelectric.

Attention is now directed to comparing the diaphragm displacement efficiency between a disc diaphragm structure 40 and an annular ring diaphragm structure 48. Turning to FIGS. 13 and 14, illustrated are charts plotting the results of finite element simulations of diaphragm displacement (nm) based on the radial distance from the center of the diaphragm (mm) for the disc structure and the annular ring structure. These charts compare three different inter-digitated electrode arrangements, where electrodes are on top of the piezoelectric (IDE 1) 114, 122, electrodes on top and bottom of the piezoelectric (IDE 2) 116, 124, and electrodes on the bottom of the piezoelectric (IDE 3) 118, 126. Each chart also plots a curve for a system implementing a known parallel plate electrode (PPE) design 120, 128. In this study, the following parameters were used: $t_{PZT}$=20 μm, $r_{Diap}$=0.5 mm (500 μm), $t_{Diap}$=38 μm, $r_{PZT}$=0.5 mm (500 μm), p=25 μm, dc=20% and E≈3V/μm.

The results of this study confirm for both structures that the double-sided (IDE2) design provides the largest displacement. In FIG. 13 the diaphragm displacement for the IDE2 disc design is about −300 nm, according to curve 116. Due to the radial inward compression experienced by the actuated piezoelectric, displacement is constrained when the center of the disc thickens due to radial stress. To improve this performance, a small circular piezoelectric portion is removed at the center of the diaphragm for stress relief so that the piezoelectric can expand. With, for example, a 100 μm piezoelectric portion removed from the center, and the resulting annular ring structure subjected to the same driving conditions as for the disc structure, the IDE2 curve 124 shows a displacement of about −440 μm. The dip on the left of the PPE curve 128, is due to the loss of the piezoelectric material at the center.

Figure 15:
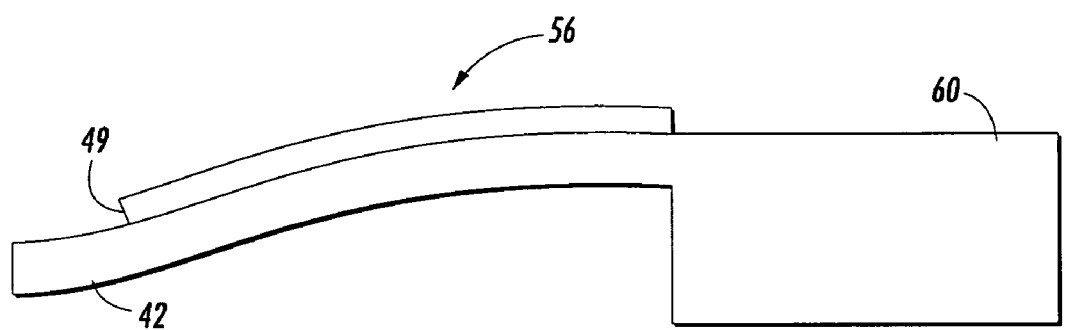
FIG. 15 is a partial side view of diaphragm displacement in accordance with parameters of FIG. 10B.

With continuing attention to annular ring structure 48, FIG. 15 is a partial side view of diaphragm displacement in accordance with the parameters of FIG. 14 having IDE 56 only on the top surface of piezoelectric annular ring 49, which is driven in a parallel expansion $d_{33}$ mode.

Figure 16:
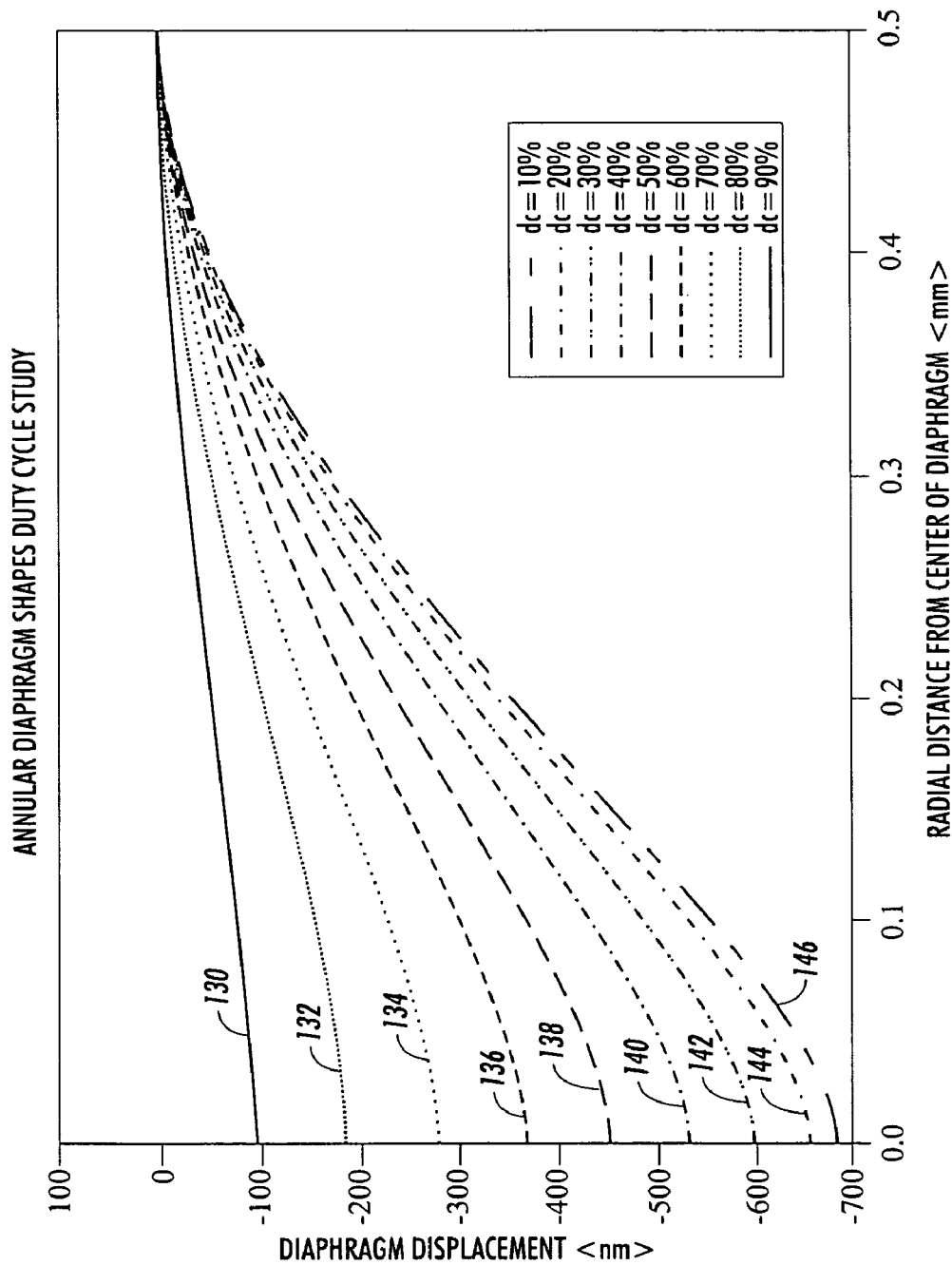
FIG. 16 is a chart containing the results of diaphragm shapes formed due to relative electrode width (i.e., duty cycle) variations.

The chart of FIG. 16 contains a set of curves 130–146 for the annular piezoelectric diaphragm structure 48, such as partially depicted in FIG. 15. The curves define diaphragm displacement (nm) versus the radial distance from the center of the diaphragm over a plurality of duty cycles (i.e., where the duty cycle is considered to be the width to pitch ratio (w/p)) ranging from 10% to 90%. The diaphragm displacement, and therefore volume displacement variation, is monotonic over the varying duty cycles. The lower duty cycles (e.g., 10%) generate the greatest negative diaphragm displacement as shown by curve 146.

Understanding the benefits of overlapping/underlapping of the piezoelectric, the use of IDEs, and the characteristics of a disc versus an annular ring in a diaphragm structure operating in a d33 mode, further finite element simulations at various underlapping or overlapping values were performed to determine optimal diaphragm structures. TABLE 1 provides some results of the simulations, as plotted in FIG. 12, for the listed specifications where an IDE is located only on the top surface. The study increased the size of the piezoelectric ($r_{PZT}$) in 50 μm steps.

TABLE 1

IDE1 ($d_{33}$) "Lap" Studies
$r_{Diap}$ = 0.5 mm, $t_{PZT}$ = 20 μm, $t_{Diap}$ = 38 μm, E ≈ 3 V/μm, p = 100 μm, dc = 10% overlap

| Case | $r_{PZT}$ (um) | $r_{PZT}/r_{diap}$ | $U_{max}$ (nm) | ΔV (pL) | Cv (pL/V) |
|---|---|---|---|---|---|
| UNDER | 100 | 0.20 | 4.89 | 0.33 | 0.0012 |
|  | 150 | 0.30 | 3.21 | 3.73 | 0.0138 |
|  | 200 | 0.40 | 44.82 | 18.09 | 0.0670 |
|  | 250 | 0.50 | 54.62 | 23.69 | 0.0877 |
|  | 300 | 0.60 | 18.65 | 36.21 | 0.1341 |
|  | 350 | 0.70 | 11.23 | 40.94 | 0.1516 |
|  | 400 | 0.80 | −109.15 | 30.49 | 0.1129 |
|  | 450 | 0.90 | −156.42 | 22.41 | 0.0830 |
| EVEN | 500 | 1.00 | −414.40 | −54.94 | −0.2035 |
| OVER | 550 | 1.10 | −506.10 | −89.70 | −0.3322 |
|  | 600 | 1.20 | −613.52 | −133.89 | −0.4959 |
|  | 650 | 1.30 | −619.41 | −136.31 | −0.5049 |
|  | 700 | 1.40 | −624.94 | −138.54 | −0.5131 |
|  | 750 | 1.50 | −625.97 | −138.96 | −0.5147 |

Use of a double-sided IDE (i.e., IDE 2) will result in larger displacements for the 20 μm piezoelectric as the in-plane E-fields are higher. Selecting the 20% overlap results as providing a desirable diaphragm displacement.

Figure 17:
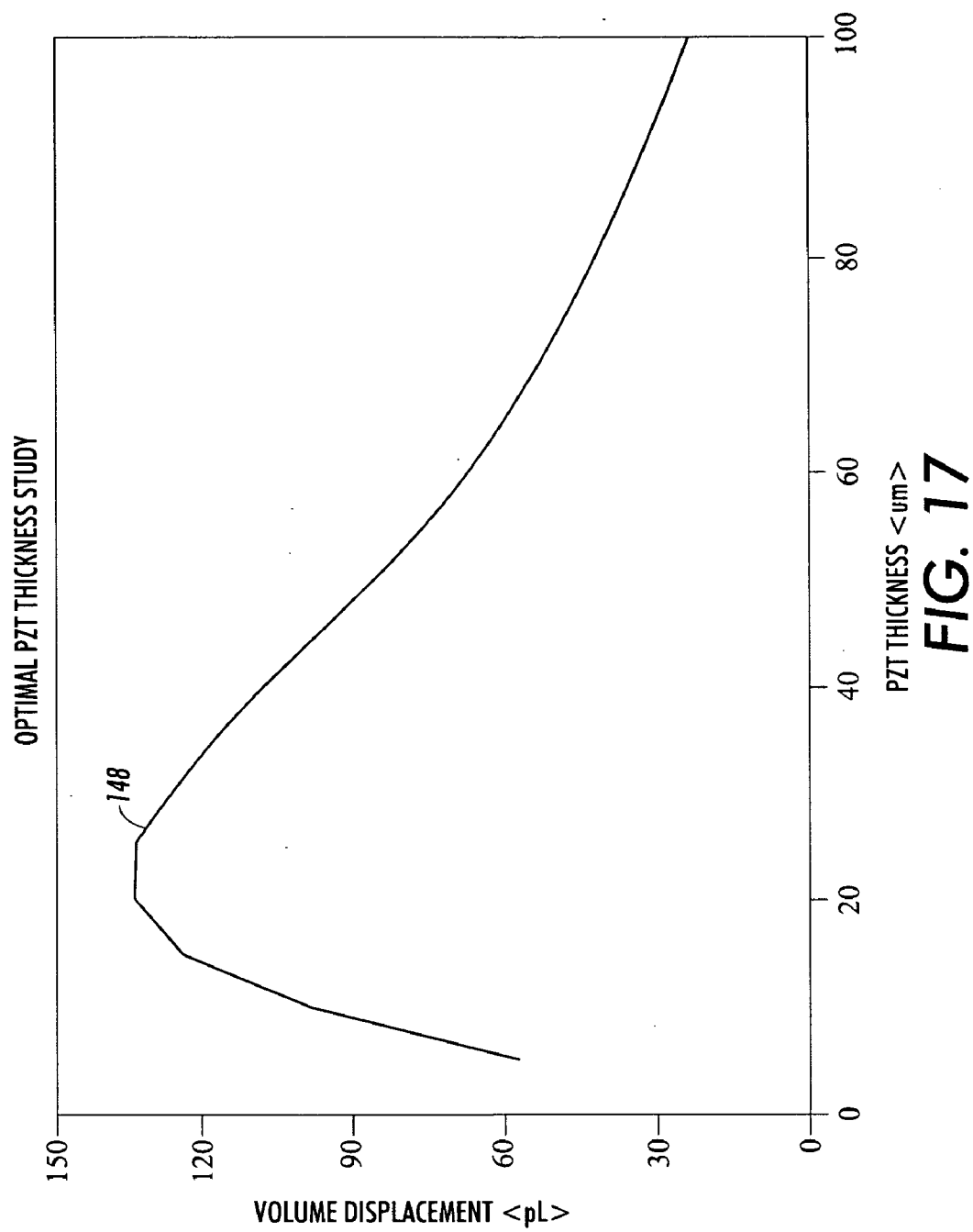
FIG. 17 presents a curve illustrating an optimal piezoelectric thickness.

The limitation to pitch is the high voltage required to maintain the E-field at 3V/μm with increasing inter-electrode spacing. Assuming a practical pitch of 100 μm, 10% electrode duty cycle, and 20% overlap, the optimal piezoelectric thickness is determined by comparing the computed diaphragm ($-U_{max}$) and volume ($-\Delta V$) displacements. In Table 2, the optimum thickness for maximum displacement (i.e., 613.52 μm and 133.89 pL) is about 20 μm. This result is also shown as the peak of curve 148 in FIG. 17, and results in a P/$t_{PZT}$ of 5, although a range where the pitch of the electrodes being 2 to 8 times the thickness of the piezoelectric would also provide useful results.

TABLE 2

IDE1 Optimal Pitch Studies
p = 100 μm, dc = 10%, $r_{Diap}$ = 0.5 mm, $t_{Diap}$ = 38 μm, E ≈ 3 V/μm, 20% overlap

| $t_{PZT}$ (um) | $t_{PZT}/p$ | −Umax (nm) | −ΔV (pL) |
|---|---|---|---|
| 5 | 0.05 | 263.17 | 56.62 |
| 10 | 0.1 | 459.42 | 99.39 |
| 15 | 0.15 | 571.06 | 124.18 |
| 20 | 0.2 | 613.52 | 133.89 |
| 25 | 0.25 | 610.06 | 133.29 |
| 30 | 0.3 | 580.52 | 126.61 |
| 40 | 0.4 | 492.46 | 106.12 |
| 50 | 0.5 | 403.95 | 85.08 |
| 60 | 0.6 | 329.45 | 67.08 |
| 70 | 0.7 | 269.91 | 52.58 |
| 80 | 0.8 | 222.84 | 41.03 |
| 90 | 0.9 | 185.48 | 31.87 |
| 100 | 1.0 | 155.57 | 24.59 |

Figure 18:
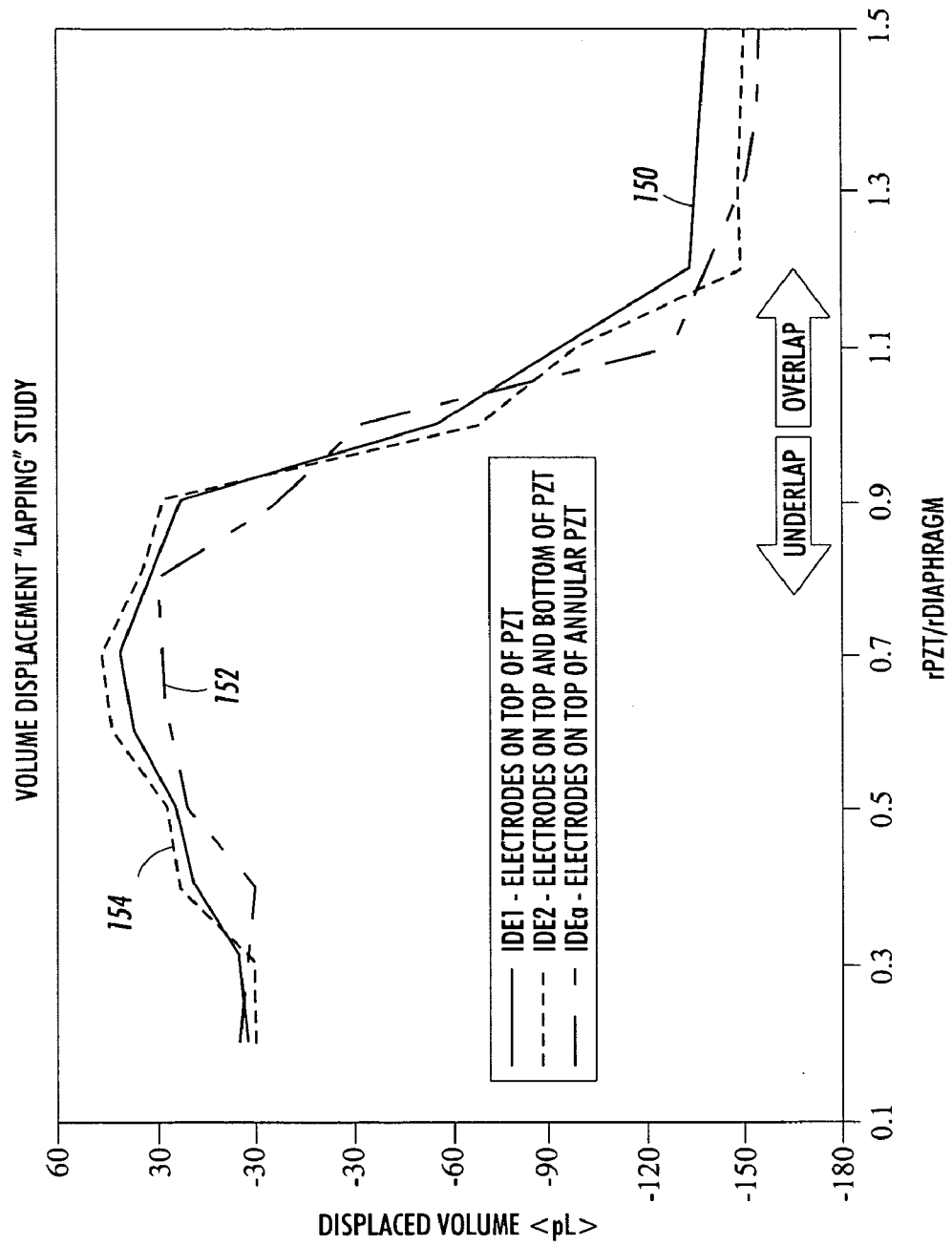
FIG. 18 illustrates the results of a volume displacement lapping study for various underlap and overlap positions.

Another characteristic to consider in optimizing the diaphragm structure are the variations of volume displacement due to different underlap and overlap conditions. FIG. 18 shows the results of this investigation for the disc and annular ring piezoelectric diaphragm structure. Each structure includes a diaphragm having a radius ($r_{Diap}$) of 500 μm, a thickness ($t_{Diap}$) of 38 μm, and a piezoelectric annular ring with a radius ($r_{PZT}$), which varies from an underlapping situation (i.e., less than 1.0) to an overlapping situation (i.e., greater than 1.0), and a thickness ($t_{PZT}$) of 20 μm. Curve 150 is for a single-sided disc diaphragm structure with an IDE on top of the piezoelectric and curve 154 is for a disc diaphragm structure with a double-sided IDE arrangement. The third curve 152 is for an annular ring diaphragm structure with 100 μm radius piezoelectric portion removed. The curves indicate that the volume displacements are smaller and positive for underlap situations, but there is a transition over to larger and negative displacement for overlap situations, with little change beyond 20% overlap for both the disc and annular ring diaphragm structures.

Turning attention to the annular ring design, the optimal inner radius of the annular ring 49 was determined by varying the annular radius from 400 μm to 0 μm. The simulation showed the peak displacement is located at an annular radius of 300 μm. TABLE 3 lists simulation results at various operational values for different annular radii ($r_{annulus}$).

TABLE 3

Performance of annular piezoelectric
$r_{diap}$ = 500 μm, $t_{diap}$ = 38 μm, $t_{PZT}$ = 20 μm, E = 3 V/μm (Cv),
P = 2 atm (Cp)

| $r_{annulus}$ <um> | ΔV <pL> |
|---|---|
| 400 | 143.58 |
| 300 | 196.69 |
| 200 | 193.69 |
| 100 | 157.10 |
| 0 | 126.85 |

Thus, from the foregoing it has been determined for a disc piezoelectric diaphragm structure, large volume displacements for voltage applied is optimized in a range of 10% to 30% overlap, and preferably at 20% overlap or a disc radius of 600 μm, covering a 500 μm diaphragm. Volume displacements are even larger for annular ring piezoelectric diaphragm structures; peaking, again, when there is an underlap of the inner radius in a range of 30% to 50%, and preferably 40% (i.e., the inner radius is about 300 μm) and the outer radius is 600 μm (i.e. 20% overlap). Of course, benefits from under and overlapping may be obtained in other ranges, such as where an inner radius (edge) dimension underlaps the diaphragm by approximately 10–50% and the outer radius edge dimension overlaps the diaphragm by approximately 3–30%.

Figure 19:
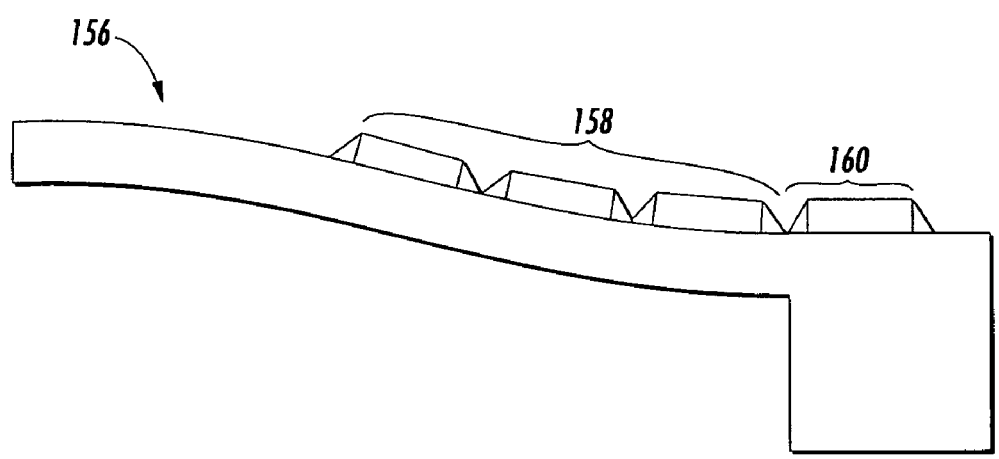
FIG. 19 depicts a partial view of an optimized annular ring diaphragm structure in accordance with the present application.

FIG. 19 shows a simulation of the annular ring diaphragm structure 156 optimized with 40% underlap of the inner radius 158 and 20% overlap of the outer radius 160.

Figure 20:
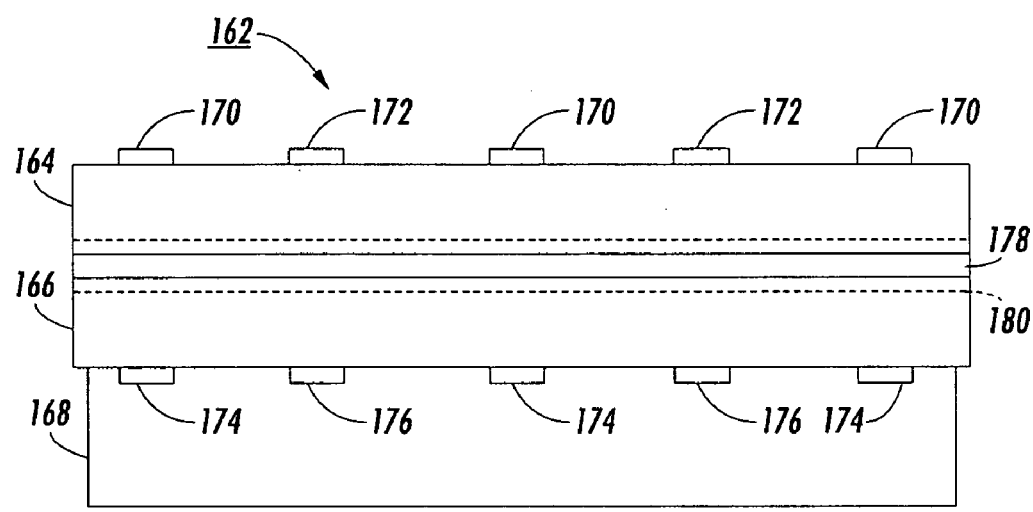
FIG. 20 depicts a bimorph structure which may be used in accordance with the present application.

The foregoing discussion has primarily focused on unimorph diaphragm. As defined herein, a unimorph diaphragm is one with a single piezoelectric. It is to be appreciated, the concepts of the present application may also be used in connection with a bimorph diaphragm structure 162, such as illustrated in FIG. 20. In this design, instead of a single piezoelectric, two piezoelectrics 164, 166 are used to actuate diaphragm 168. Piezoelectric 164 is provided with energy via electrodes 170 and 172. Whereas piezoelectric 166 is supplied with energy via electrodes 174 and 176. In this figure, electrodes 174 and 176 are shown on a bottom surface of piezoelectric 166. It is to be understood that this is simply one embodiment, and these electrodes may be on a top surface as in other designs. The bimorph piezoelectric element 164, 166 may also be designed with each piezoelectric elements 164 and 166 having electrodes on both upper and bottom surfaces. The piezoelectrics may be connected to each other by an adhesive interface 178. However, alternatively, and as shown by the dotted line, an inert conductive centerplate 180 may be provided to isolate the two piezoelectric structures from each other. In one embodiment, the centerplate may be a stainless steel plate. Piezoelectrics 164, 166 may be configured as discs, annular rings, or a combination thereof, as disclosed in the preceding discussion.

Returning attention to two-region diaphragm structure 50 of FIGS. 4A, 4B and 7A, 7B, in operation one of the regions, for example the disc region 52, as illustrated in FIG. 7A, will have a positive voltage applied. The other region (i.e., the annular ring region 51) will have a voltage applied relative to common bottom electrode 54c. Given uniform poling in a Z-axis, one region will expand, causing bending in a concave down fashion, and the other region will contract causing bending concave upwards. Both of these motions work together to provide a maximum total deflection. The selection where the occurrence of a concave-down versus a concave-up transition exists, is guided by the natural bending modes of the diaphragm and is shown by boundary 53.

Figure 21:
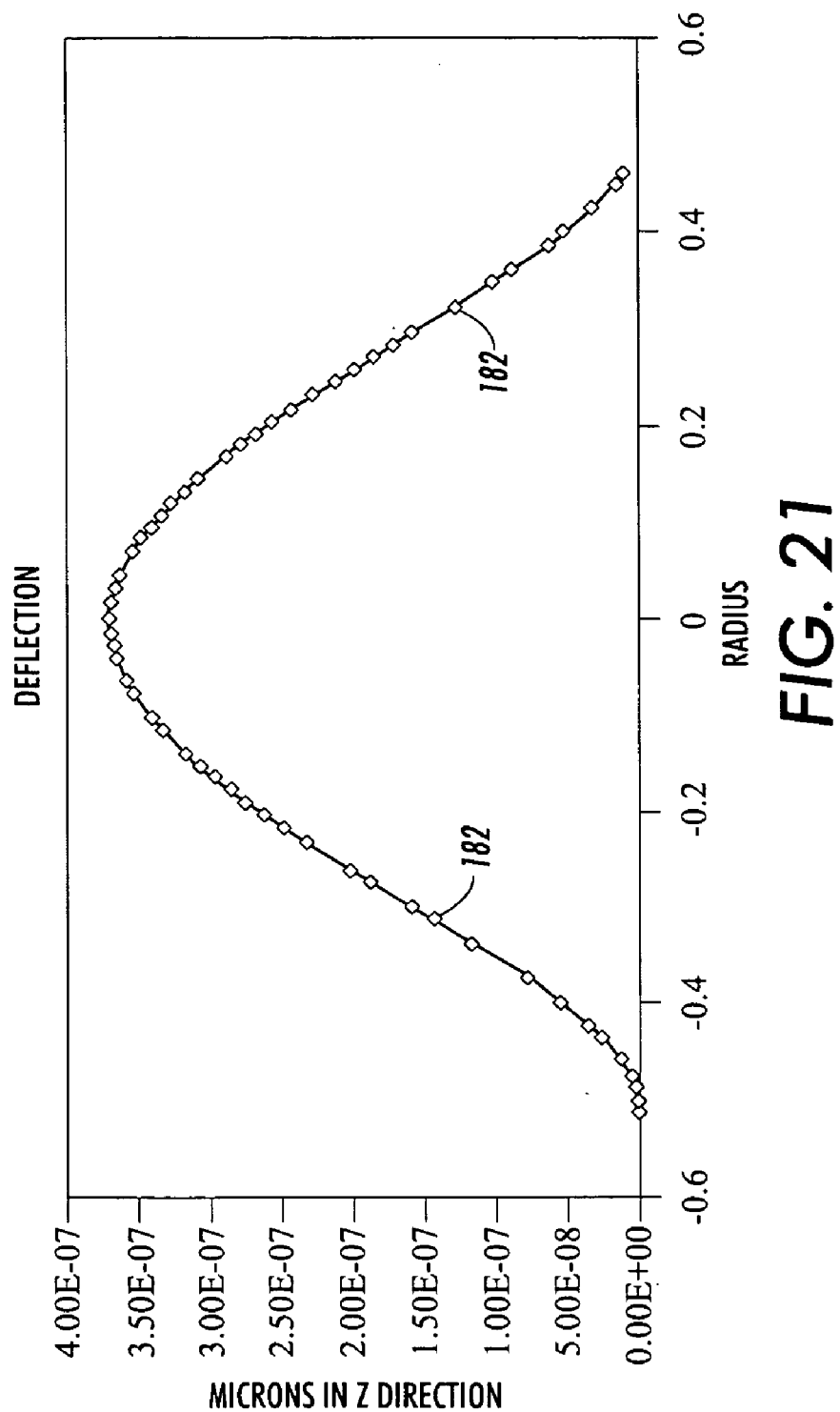
FIG. 21 is a chart illustrating the results of deflection for a two-region diaphragm structure.

Since the selection of boundary 53 between annular ring region 51 and disc region 52 does not affect stiffness, a simulation of the deformation of the diaphragm under applied pressure will appear the same for all locations of the boundary. FIG. 21 provides the results of such modeling for an active diaphragm having a 500 micron radius. A reasonable fit to the data provides a simple polynomial which can be solved analytically to define various features of the system. The radius of inflection in one dimension (R) and the radius which corresponds to the sum of the second derivatives (2-D equating to zero (2-D "inflection", a "saddle point" R, and Theta)) 182 is noted in FIG. 21.

Total 2-D inflection radius is the radius (e.g., approximately 0.36) where curvature in the X-axis plus the curvature in the Y-axis is equal to zero. On first inspection, it may be assumed that the optimum boundary location 53 would correspond to the inflection point on the R axis (1-D).

Figure 22:
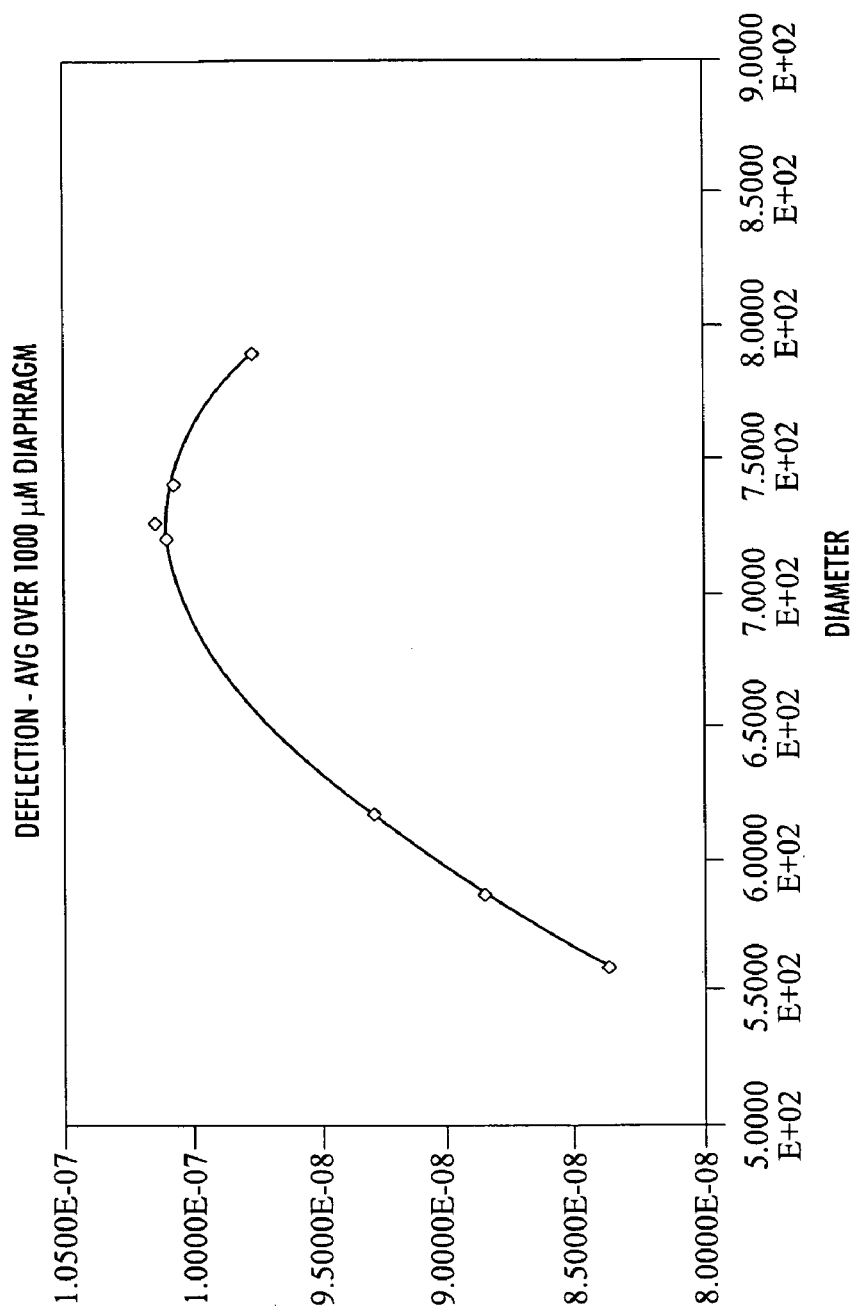
FIG. 22 is a chart depicting an optimum boundary point for a two-region diaphragm structure according to the present application.

However, the optimum boundary point turns out to be the 2-D inflection location, as illustrated in FIG. 22 (i.e., for a 1,000 micron diameter, each point is the result of a simulation run, and the optimum is approximately 73%, compared to the 72% from analysis in FIG. 21). For voltages applied oppositely to the disc region 52 and the annular ring region 51 (on their tops with respect to the bottom), the piezoelectric material tends to curl down in the center and curl up around the edge. The ideal location for the boundary 53 utilizes this tendency to produce the optimal displacement of the diaphragm when voltage is applied.

From a simulation with a typical diaphragm structure, this two-electrode 54a, 54b design provides an approximate 57% improvement of volume displacement versus voltage over an optimal single electrode design (with diameters scaled to give matching $C_p$, where $C_p$ is volume displacement per unit pressure applied). The optimum $C_v$ (where Cv is the volume displaced per unit volt applied) for a single electrode design, with a thickness of material used in this example, is with approximately 80% coverage of the diaphragm with the piezoelectric material.

In the described structures, maximum deflection of the diaphragm occurs, since the contraction and expansion of the piezoelectric material is matched to the two natural bending regions of the diaphragm. Contraction is initiated in the central region when it is desired to have a concave-up position. An expansion of the piezoelectric in the central region is used when it is desired to have a concave-down position (given that the piezoelectric material is on top of the diaphragm). The overall stiffness pressure per volume displaced ($1/C_p$) is maintained and even improved over conventional single electrode construction, and the voltage requirements for actuation is decreased. Stated alternatively, the volume displaced per unit volt applied ($C_v$) is increased over single region designs.

While the exemplary embodiment has been described with respect to specific embodiments by way of illustration, many modifications and changes will occur to those skilled in the art. It is, therefore, to be understood that the appended claims are intended to cover all such modifications and changes as fall within the scope and spirit of the exemplary embodiment.

What is claimed is:

1. A piezoelectric diaphragm structure comprising:
   a diaphragm;
   a piezoelectric material located on the diaphragm, the piezoelectric material poled in a radial direction of the piezoelectric material, wherein the poling direction is in-plane with the piezoelectric material;
   an inter-digitated electrode grid positioned on a first surface of the piezoelectric material, the inter-digitated electrode grid including a plurality of electrodes configured to selectively receive positive and negative voltages, wherein application of the positive and negative voltages generate electric fields in the piezoelectric material, at least a portion of which are in-plane with the piezoelectric material and which results in an actuation of the piezoelectric material, causing a length change of the piezoelectric material in the Radial direction.

2. The structure according to claim 1, wherein the piezoelectric material includes a central region.

3. The structure according to claim 2, wherein the central region is configured to overlap the diaphragm by approximately 3–30%.

4. The structure according to claim 3, wherein a pitch of the electrodes is approximately 2–8 times a thickness of the piezoelectric.

5. The structure according to claim 1, wherein the piezoelectric material is in the form of an outer region having an inner edge and an outer edge.

6. The structure according to claim 5, wherein the inner edge dimension underlaps the diaphragm by approximately 10–50% and the outer edge dimension overlaps the diaphragm by approximately 3–30%.

7. The structure according to claim 6, wherein a pitch of the electrodes is 2–8 times a thickness of the piezoelectric.

8. The structure according to claim 1, further including a second inter-digitated electrode grid on a second surface of the piezoelectric material.

9. The structure according to claim 1, further including a second piezoelectric material associated with the first piezoelectric material and a first interdigitated electrode grid formed on a first surface of the second piezoelectric material to form a bi-morph element.

10. The structure according to claim 1, wherein the diaphragm is designed to eject a fluid.

11. The structure according to claim 10, wherein the fluid is at least one of ink, water or bio-fluid.

12. The structure according to claim 2, wherein the central region location and size are matched in contraction/expansion modes to a natural bending location of the diaphragm.

13. The structure according to claim 5, wherein the outer region location and size are matched in contraction/expansion modes to a natural bending location of the diaphragm.

14. The structure according to claim 1, wherein the voltages are adjusted as required by variation in the pitch.

15. The structure according to claim 1, wherein the piezoelectric material is at least one of a central region or an outer region.

16. A method of actuating a piezoelectric diaphragm structure comprising:
    poling a piezoelectric material in a radial direction of the piezoelectric material, wherein the poling direction is in-plane with the piezoelectric material;
    locating the piezoelectric material in operative contact with a diaphragm;
    supplying, selectively, an electrode arrangement located on a surface of the piezoelectric material with voltages; and
    generating electric fields, in response to the supplied voltages, at least partially in a same plane as the poling direction, which results in plane in an actuation of the piezoelectric material, causing a length change of the piezoelectric material in the Radial direction.

17. The method according to claim 16, further including forming the piezoelectric material as one of a center region or outer region, wherein the outer region includes an inner edge and outer edge.

18. The method according to claim 17, wherein the forming step includes forming the center region to overlap the diaphragm by approximately 30–30%.

19. The method according to claim 18, wherein the forming step includes locating the electrode arrangement at a pitch of approximately 2–8 times a thickness of the piezoelectric.

20. The method according to claim 17, wherein the forming step includes forming the outer region such that the inner edge underlaps the diaphragm by approximately 10–50% and the outer region, outer edge overlaps the diaphragm by approximately 3–30%.

21. The method according to claim 17, wherein the forming step includes locating the electrode arrangement at a pitch approximately 2–8 times a thickness of the piezoelectric.

22. The method according to claim 16, further including supplying, selectively, portions of the electrodes with voltages, wherein the supplying causes a displacement of the diaphragm.

23. A piezoelectric diaphragm structure comprising:
a diaphragm;
a piezoelectric located on the diaphragm, the piezoelectric poled in a radial direction of the piezoelectric material, wherein the poling direction is in-plane with the piezoelectric material;
an electrode arrangement positioned on a first surface of the piezoelectric material, the electrode arrangement configured to at least one of receive voltages or pass electrical charge, wherein (i) the receipt of the voltages generates electric fields in the piezoelectric material, at least a portion of which are in-plane with the piezoelectric material, resulting in actuation of the piezoelectric material, and (ii) the passing of the electrical charge is in response to movement of the diaphragm.

24. The structure according to claim 23, wherein the piezoelectric material is at least one of a central region or an outer region.

25. The structure according to claim 24, wherein the central region is configured to overlap the diaphragm by approximately 3–30%.

26. The structure according to claim 24, wherein the piezoelectric is in the form of an outer region having an inner edge and an outer edge.

27. The structure according to claim 24, wherein the inner edge of the outer region underlaps the diaphragm by approximately 30–50% and the outer edge overlaps the diaphragm by approximately 3–30%.

28. The structure according to claim 24, wherein the piezoelectric in the central region of the diaphragm is formed as a disc and in the outer region of the diaphragm is formed as an annular ring.

29. The structure according to claim 28, further including a boundary between the disc and the annular ring, wherein the boundary aligned with the natural bending of the diaphragm is at a second inflection location.

30. The structure according to claim 28, wherein the electrode arrangement includes a first set of electrodes to activate the disc piezoelectric and a second set of electrodes to actuate the annular ring, wherein the first set and the second set are driven by voltages to create expansion or contraction of the disc piezoelectric opposite that of the annular ring.

31. The structure according to claim 23, wherein when the electrode arrangement is used to receive a voltage, the diaphragm structure is functioning as an actuator, and when the electrode arrangement is used to pass an electrical charge, the diaphragm structure is functioning as a sensor.

* * * * *